US 12,224,750 B2

(12) United States Patent
Amin et al.

(10) Patent No.: US 12,224,750 B2
(45) Date of Patent: Feb. 11, 2025

(54) TOPOLOGICALLY PROTECTED QUBITS, PROCESSORS WITH TOPOLOGICALLY PROTECTED QUBITS, AND METHODS FOR USE OF TOPOLOGICALLY PROTECTED QUBITS

(71) Applicant: D-WAVE SYSTEMS INC., Burnaby (CA)

(72) Inventors: Mohammad H. Amin, Coquitlam (CA); Richard G. Harris, North Vancouver (CA)

(73) Assignee: 1372934 B.C. LTD., Burnaby (CA)

( * ) Notice: Subject to any disclaimer, the term of this patent is extended or adjusted under 35 U.S.C. 154(b) by 82 days.

(21) Appl. No.: 17/883,874

(22) Filed: Aug. 9, 2022

(65) Prior Publication Data

US 2023/0370069 A1    Nov. 16, 2023

Related U.S. Application Data

(60) Provisional application No. 63/240,675, filed on Sep. 3, 2021.

(51) Int. Cl.
*H03K 19/195*    (2006.01)
*G06N 10/40*    (2022.01)

(52) U.S. Cl.
CPC ........... *H03K 19/195* (2013.01); *G06N 10/40* (2022.01)

(58) Field of Classification Search
CPC ...... H03K 19/195; G06N 10/40; G06N 10/60; G06N 10/70
See application file for complete search history.

(56) References Cited

U.S. PATENT DOCUMENTS

| | | |
|---|---|---|
| 3,573,759 A | 4/1971 | Zimmerman et al. |
| 4,028,714 A | 6/1977 | Henkels |

(Continued)

FOREIGN PATENT DOCUMENTS

| | | |
|---|---|---|
| DE | 19511172 A1 | 10/1996 |
| EP | 0251568 A1 | 1/1988 |

(Continued)

OTHER PUBLICATIONS

Al-Saidi et al., "Eigenstates of a small Josephson junction coupled to a resonant cavity", Physical Review B, 65, pp. 014512-1 to 014512-7, 2001.

(Continued)

*Primary Examiner* — Seokjin Kim
(74) *Attorney, Agent, or Firm* — Cozen O'Connor

(57) ABSTRACT

A logical qubit, a quantum processor, and a method of performing an operation on the logical qubit are discussed. The logical qubit includes first and second tunable couplers and a plurality of fixed couplers, with at least one fixed coupler providing four physical qubit interaction. The first and second tunable couplers and the fixed couplers enforce even parity in any connected qubits. The logical qubit has a plurality of physical qubits with qubits connected to the first tunable coupler and a first fixed coupler, qubits connected to the second tunable coupler and a second fixed coupler, and qubits connected between the first fixed coupler and the second fixed coupler. Each fixed coupler is connected to at least two physical qubits and at least two paths connect the first tunable coupler and the second tunable coupler, with one path communicating with a microwave line.

20 Claims, 11 Drawing Sheets

(56) References Cited

U.S. PATENT DOCUMENTS

| | | |
|---|---|---|
| 4,504,926 A | 3/1985 | Toyoda |
| 4,769,753 A | 9/1988 | Knudson et al. |
| 4,956,642 A | 9/1990 | Harada |
| 5,162,731 A | 11/1992 | Fujimaki |
| 5,323,344 A | 6/1994 | Katayama et al. |
| 5,326,986 A | 7/1994 | Miller et al. |
| 5,329,165 A | 7/1994 | Kao et al. |
| 5,768,297 A | 6/1998 | Shor |
| 5,787,307 A | 7/1998 | Imoto |
| 5,869,846 A | 2/1999 | Higashino et al. |
| 5,917,322 A | 6/1999 | Gershenfeld et al. |
| 6,128,764 A | 10/2000 | Gottesman |
| 6,157,044 A | 12/2000 | Nakanishi et al. |
| 6,169,981 B1 | 1/2001 | Werbos |
| 6,317,766 B1 | 11/2001 | Grover |
| 6,360,112 B1 | 3/2002 | Mizuno et al. |
| 6,459,097 B1 | 10/2002 | Zagoskin |
| 6,495,854 B1 | 12/2002 | Newns et al. |
| 6,504,172 B2 | 1/2003 | Zagoskin et al. |
| 6,563,310 B2 | 5/2003 | Zagoskin |
| 6,563,311 B2 | 5/2003 | Zagoskin |
| 6,605,822 B1 | 8/2003 | Blais et al. |
| 6,614,047 B2 | 9/2003 | Tzalenchuk et al. |
| 6,627,915 B1 | 9/2003 | Ustinov et al. |
| 6,633,053 B1 | 10/2003 | Jaeger |
| 6,649,929 B2 | 11/2003 | Newns et al. |
| 6,670,630 B2 | 12/2003 | Blais et al. |
| 6,728,131 B2 | 4/2004 | Ustinov |
| 6,753,546 B2 | 6/2004 | Tzalenchuk et al. |
| 6,803,599 B2 | 10/2004 | Amin et al. |
| 6,838,694 B2 | 1/2005 | Esteve et al. |
| 6,885,325 B2 | 4/2005 | Omelyanchouk et al. |
| 6,897,468 B2 | 5/2005 | Blais et al. |
| 6,900,454 B2 | 5/2005 | Blais et al. |
| 6,900,456 B2 | 5/2005 | Blais et al. |
| 6,911,664 B2 | 6/2005 | Il et al. |
| 6,919,579 B2 | 7/2005 | Amin et al. |
| 6,930,320 B2 | 8/2005 | Blais et al. |
| 6,943,368 B2 | 9/2005 | Amin et al. |
| 6,960,780 B2 | 11/2005 | Blais et al. |
| 6,979,836 B2 | 12/2005 | Zagoskin et al. |
| 7,002,174 B2 | 2/2006 | Il et al. |
| 7,015,499 B1 | 3/2006 | Zagoskin |
| 7,135,701 B2 | 11/2006 | Amin et al. |
| 7,230,266 B2 | 6/2007 | Hilton et al. |
| 7,253,654 B2 | 8/2007 | Amin |
| 7,307,275 B2 | 12/2007 | Lidar et al. |
| 7,418,283 B2 | 8/2008 | Amin |
| 7,533,068 B2 | 5/2009 | Maassen et al. |
| 7,605,600 B2 | 10/2009 | Harris |
| 7,613,764 B1 | 11/2009 | Hilton et al. |
| 7,624,088 B2 | 11/2009 | Johnson et al. |
| 7,843,209 B2 | 11/2010 | Berkley |
| 7,876,248 B2 | 1/2011 | Berkley et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,102,185 B2 | 1/2012 | Johansson et al. |
| 8,169,231 B2 | 5/2012 | Berkley |
| 8,190,548 B2 | 5/2012 | Choi |
| 8,195,596 B2 | 6/2012 | Rose et al. |
| 8,421,053 B2 | 4/2013 | Bunyk et al. |
| 8,536,566 B2 | 9/2013 | Johansson et al. |
| 8,611,974 B2 | 12/2013 | Maibaum et al. |
| 8,644,898 B1 | 2/2014 | De Andrade et al. |
| 8,854,074 B2 | 10/2014 | Berkley |
| 8,951,808 B2 | 2/2015 | Ladizinsky et al. |
| 9,152,923 B2 | 10/2015 | Harris et al. |
| 9,495,644 B2 | 11/2016 | Chudak et al. |
| 9,870,277 B2 | 1/2018 | Berkley |
| 10,037,493 B2 | 7/2018 | Harris et al. |
| 10,068,180 B2 | 9/2018 | Amin et al. |
| 10,312,141 B2 | 6/2019 | Kirby et al. |
| 10,528,886 B2 | 1/2020 | Boothby |
| 11,127,893 B2 | 9/2021 | Johnson et al. |
| 11,424,521 B2 | 8/2022 | Whittaker et al. |
| 11,494,683 B2 | 11/2022 | Amin et al. |
| 2001/0020701 A1 | 9/2001 | Zagoskin |
| 2001/0023943 A1 | 9/2001 | Zagoskin |
| 2002/0117656 A1 | 8/2002 | Amin et al. |
| 2002/0179937 A1 | 12/2002 | Ivanov et al. |
| 2002/0180006 A1 | 12/2002 | Franz et al. |
| 2002/0188578 A1 | 12/2002 | Amin et al. |
| 2003/0071258 A1 | 4/2003 | Zagoskin et al. |
| 2003/0111661 A1 | 6/2003 | Tzalenchuk et al. |
| 2003/0193097 A1 | 10/2003 | Il et al. |
| 2003/0207766 A1 | 11/2003 | Esteve et al. |
| 2003/0224944 A1 | 12/2003 | Il et al. |
| 2004/0000666 A1 | 1/2004 | Lidar et al. |
| 2004/0012407 A1 | 1/2004 | Amin et al. |
| 2004/0016918 A1 | 1/2004 | Amin et al. |
| 2004/0071019 A1 | 4/2004 | Magnus et al. |
| 2005/0224784 A1 | 10/2005 | Amin et al. |
| 2006/0147154 A1* | 7/2006 | Thom .................... G06N 10/00 385/37 |
| 2008/0215850 A1 | 9/2008 | Berkley et al. |
| 2011/0057169 A1 | 3/2011 | Harris et al. |
| 2011/0060780 A1 | 3/2011 | Berkley et al. |
| 2012/0094838 A1 | 4/2012 | Bunyk et al. |
| 2012/0124432 A1 | 5/2012 | Pesetski et al. |
| 2014/0229722 A1 | 8/2014 | Harris |
| 2015/0032991 A1 | 1/2015 | Lanting et al. |
| 2015/0219730 A1 | 8/2015 | Tsukamoto et al. |
| 2015/0263736 A1 | 9/2015 | Herr et al. |
| 2016/0132785 A1 | 5/2016 | Amin et al. |
| 2016/0335558 A1 | 11/2016 | Bunyk et al. |
| 2017/0256698 A1 | 9/2017 | Nayfeh et al. |
| 2018/0054201 A1* | 2/2018 | Reagor ................ H03K 19/195 |
| 2018/0247217 A1 | 8/2018 | Heeres et al. |
| 2018/0314970 A1 | 11/2018 | Harris et al. |
| 2018/0341874 A1 | 11/2018 | Puri et al. |
| 2019/0164959 A1 | 5/2019 | Thomas et al. |
| 2019/0392878 A1 | 12/2019 | Murduck et al. |
| 2020/0036332 A1 | 1/2020 | Abdo |
| 2020/0090738 A1 | 3/2020 | Naaman et al. |
| 2020/0320426 A1 | 10/2020 | Amin et al. |
| 2020/0401649 A1* | 12/2020 | Lanting .................. G06F 17/00 |
| 2021/0073667 A1 | 3/2021 | Harris |
| 2022/0020913 A1 | 1/2022 | Harris et al. |
| 2023/0027682 A1 | 1/2023 | Molavi et al. |
| 2023/0106489 A1* | 4/2023 | Harris .................... G06N 10/40 716/100 |

FOREIGN PATENT DOCUMENTS

| | | | |
|---|---|---|---|
| EP | 0916961 A2 | 5/1999 | |
| EP | 1085422 A2 | 3/2001 | |
| EP | 3665624 B1 * | 4/2024 | ............ G06F 15/80 |
| KR | 20190015330 A | 2/2019 | |
| WO | 9612305 A1 | 4/1996 | |
| WO | 03090161 A2 | 10/2003 | |
| WO | 03090161 A3 | 2/2005 | |
| WO | 2012064974 A2 | 5/2012 | |
| WO | 2015013532 A1 | 1/2015 | |
| WO | 2017192733 A2 | 11/2017 | |
| WO | 2019126396 | 6/2019 | |
| WO | 2021126875 A1 | 6/2021 | |
| WO | 2022155140 A1 | 7/2022 | |
| WO | 2023004040 A1 | 1/2023 | |
| WO | 2023219656 A2 | 11/2023 | |

OTHER PUBLICATIONS

Armour et al., "Entanglement and Decoherence of a Micromechanical Resonator via Coupling to a Cooper-Pair Box", Physical Review Letters, 88, pp. 148304-1 to 148301-4, 2002.

Averin et al., "Quantum Computing and Quantum Measurements With Mesoscopic Josephson Junctions", Fortschritte der Physik 48, pp. 1055-1074, 2000.

Barone et al., "Quantum Computation With Aharonov-Bohm Qubits", WWW.arXiv.org preprint: cond-mat/0203038 v1 (Mar. 2, 2002).

(56) References Cited

OTHER PUBLICATIONS

Blais et al., "Quantum netWork optimization", Physical Review A, 64, pp. 022312-1 to 022312-5 (2001).
Buisson et al., "Entangled states in a Josephson charge qubit coupled to a superconducting resonator", arXiv.org:cond/mat/0008275 (2000).
Burkard et al., "Spintronics and Quantum Dots for Quantum Computing and Quantum Communication," Fortschritte der Physik 48, pp. 965-986, 2000.
Cory et al., "NMR Based Quantum Information Processing: Achievements and Prospects", Fortschritte der Physik 48, pp. 875-907, 2000.
Cottet et al., "Implementation of a combined charge-phase quantum bit in a superconducting circuit", Physica C 367, pp. 197-203, 2002.
DiVincenzo et al., "Experimental Proposals for Quantum Computaton", H—K Lo and S.L. Braunstein (eds.), chapter 1, Wiley-VCH Verlag GmbH, Berlin (2001), also published WWW. ArXiv.org preprint: quant-ph/0002077 (Apr. 13, 2000).
Dykman, "Quantum Computing Using Electrons Floating on Liquid Helium", Fortschritte der Physik 48, pp. 1095-1108, 2000.
Ettinger et al., "An Integrated 20 GHZ SiGe Bipolar Differential Oscillator With High Tuning Range".
Grangier et al., "Implementations of Quantum Computing Using Cavity Quantum Electrodynamics", Fortschritte der Physik 48, pp. 859-874, 2000.
Hekking et al., "Cooper Pair BOX Coupled to a Current-Biased Josephson Junction", arXiv.org:cond-mat/0201284 (2002).
Hu et al., "Decoherence and dephasing in spin-based solid state quantum computers", arXiv.org:cond-mat/0108339 (2001).
Joyez et al., "Observation of Parity-Induced Suppression of Josephson Tunneling in the Superconducting Single Electron Transistor", hysical Review Letters, 72(15)12458 2461, (1994).
Kane et al., "Silicon-based Quantum Computation", Fortschritte der Physik 48, pp. 1023-1041, 2000.
Kulik et al., "Quantum Computational Gates With Radiation Free Couplings", WWW.arXiv.org preprint1 cond-mat/0203313 v1 (Mar. 14, 2002).
Leggett et al., "Dynamics of the dissipative tWo-state system", Reviews of Modern Physics, 59, pp. 1-85, 1987.
Lidar et al., "Quantum Codes for Simplifying Design and Suppressing Decoherence in Superconducting Phase-Qubits", Quant. Inf. Proc. 1, pp. 155-182, 2002.
Lidar et al., "Reducing Constraints on Quantum Computer Design by Encoded Selective Recoupling", Phys. Rev. Lett. 88, 017905, pp. 1-4, 2002.
Majer et al., "Simple phase bias for superconducting circuits", Applied Physics Letters 80 pp. 3638-3640, 2002.
Makhlin et al., "Josephson-Junction Qubits", Fortschritte der Physik 48, pp. 1043-1054, 2000.
Marquardt et al., "Superposition of tWo mesoscopically distinct quantum states: Coupling a Cooper-pair box to a large superconducting island", Physical Review B, 63, pp. 054514-054520 (2001).
Mooij et al., "Quantum superposition of macroscopic persistent-current states", Science, 290, pp. 773-777, 2000.
Olariu et al., "The quantum effects of electromagnetic fluxes," Rev. Mod. Phys. 57, pp. 339-436 and 13 pages of figures, 1987.
Orlando et al., "Engineering the Quantum Measurement Process for the Persistent Current Qubit", Physica C 3681294-299 (Mar. 2002).
Plastina et al. "Communicating Josephson qubits", arXiv.org:cond-mat/0206586 (2002).
Poyatos et al., "Schemes of Quantum Computations With Trapped Ions", Fortschritte der Physik 48, pp. 785-799, 2000.
Rifkin et al., "Current-Phase relation and phase-dependent conductance of superconducting point contacts from rf impedance measurements", Phys. Rev. B ]313894-3901 (1976).
Schmidt, "The Physics of Superconductors", P. Muller and AV. Ustinov (Eds.), Springer, 1997, chapter 4.
Shnirman et al., "Quantum measurements performed With a single-electron transistor", Phys. Rev. B 57(24) 115400-15407 (1998).

Spiller et al., "Superconducting Circuits for Quantum Computing," Fortschritte der Physik 48, pp. 1075-1094, 2000.
Tanaka et al., "DC SQUID Readout Readout for Qubit," Physica C, 3681300 304 (Mar. 2002).
Vion et al., "Manipulating the quantum state of an electrical circuit", Science, 296, pp. 886-889 (2002).
Yu et al., "Coherent temporal oscillations of macroscopic quantum states in a Josephson junction", Science, 296, pp. 889-892, 2002.
Zhang et al., "Substrate resonator for HTS rf SQUID operation", Physica C 372-3761282-286 (2002).
Zorin, "Quantum-Limited Electrometer Based on Single Cooper Pair Tunneling", Phys. Rev. Lett. 76, pp. 4408-4411, 1996.
Zorin, "Radio-Frequency Bloch-Transistor Electrometer", Phys. Rev. Lett. 86, pp. 3388-3391, 2001.
Zurek, "Decoherence and the transition from quantum to classical", Physics Today, 44, 10, pp. 36-44, 1991.
Benjamin, "Schemes for Parallel Quantum Computation Without Local Control of Qubits", arXiv:quant-ph/99099007v2, Sep. 18, 1999, 12 pages.
Benjamin, Quantum Computing Without Local Control of Qubit-Qubit Interactions, 2001, 4 pages.
Bravyi, et al., "Hight-threshold and low-overhead fault-tolerant quantum memory", arXiv:2308.07915v1 [quant-ph] Aug. 15, 2023, 38 pages.
Bravyi, et al., "Universal quantum computation with ideal Clifford gates and noisy ancillas", arXiv:quant-ph/0403025v2 Dec. 16, 2004, 15 pages.
Carelli et al., "SQUID Systems for Macroscopic Quantum Coherence and Quantum Computing", IEEE trans. Apple. Supercond., Mar. 1, 2001. https://ieeexplore.ieee.org/document/919321.
Chamberland et al, "Building a Fault-Tolerant Quantum Computer Using Concatenated Cat Codes", arXiv:2012.04108v2 [quant-ph] Jan. 27, 2022,117 page.
Cosmelli et al, "An Integrated System of SQUIDs for the Study of Macroscopic Quantum Coherence", Supercond. Sci. Technol. 14, 2001.
Gottesman, et al., "Stabilizer Codes and Quantum Error Correction", arXiv:quant-ph/9705052v1, May 28, 1997, 122 pages.
Harris et al., 'A Compound Josephson Junction Coupler for Flux Qubits With Minimal Crosstalk', arXiv:0904.3784v3, Jul. 2009.
International Search Report and Written Opinion for PCT/US2022/012000 mailed Apr. 21, 2022, 11 pages.
Litinski, et al., "A Game of Surface Codes: Large-Scale Quantum Computing with Lattice Surgery", arXuv:1808.0289.02892v3 [quant=ph] Feb. 3, 2019, 37 pages.
Manucharyan, et al., "Fluxonium: single Cooper Pair circuit free of charge offsets", arXiv:0906.0831v2 [cond-mat.mes-hall] Oct. 20, 2009, 13 pages.
Mizuta, et al., "Quantum and Tunnelling Capacitance in Charge and Spin Qubits", arXiv:1604.02884v2 [cond-mat.mes-hall] Aug. 16, 2016, 9 pages.
Neill, "A path towards quantum supremacy with superconducting qubits", PHD Thesis—University of California, Dec. 1, 2017.
Neven, "Suppressing quantum errors by scaling a surface code logical qubit", arXiv:2207.06431v1 [quant-ph] Jul. 13, 2022, 44 pages.
Nguyen et al, "Scalable High-Performance Fluxonium Quantum Processor", arXiv:2201.09374v2 [quant-ph] Feb. 5, 2022, 29 pages.
Orlando et al, "Flux-based Superconducting Qubits for Quantum Computation" Physica C 372-376, 194-200, 2002.
Ortlepp et al., "Access Time and Power Dissipation of a Model 256-Bit Single Flux Quantum RAM", IEEE Transactions on Applied Superconductivity, vol. 24, No. 4, Aug. 2014.
Ortlepp et al., "Design Guidelines for Suzuki Stacks as Reliable High-speed Josephson Voltage Drivers", Superconductor Science Technology, 26 (2013) 035007 (12pp).
Raussendorf, et al., "Fault-Tolerant quantum computation with high threshold in two dimensions", arXiv:quant-ph/0610082v2, May 14, 2007, 4 pages.
Tokunaga et al., "SiO2 passivation film effects on YBCO junctions", Science Direct, Sep. 10, 1998.
Yamamoto, "Flux Driven Josephson Parametric Amplifier", arXiv:0808.1386v1 [cond-mat.supr-con] 2008.

(56) References Cited

OTHER PUBLICATIONS

Yan et al., "A tunable coupling scheme for implementing high-fidelity two-qubit gates", Arxiv:1803.09813v1, Mar. 26, 2018.
Aassime et al., "Radio-frequency Single-electron Transistor as Readout Device for Qubits: charge sensitivity and backaction", Phys Rev Lett 86, pp. 3376-3379, 2001.
Benatti et al., "Testing Macroscopic Quantum Coherence", Il Nuovo Cimento B 110, No. 5-6, pp. 593-610, 1995.
Briegel et al., "Quantum repreaters for Communication", arXiv.org:quant-ph/9803056, pp. 1-8 (1998), 1998.
Castellano et al., "A Squid Switch for a Macroscopic Quantum Coherence Experiment", Inst. Phys. Conf. Ser. No. 167, pp. 593-596 (2000).
Costabile et al., "rf-Induced steps in intermediate length Josephson-tunnel junctions", J Appl Phys 63, pp. 5406-5410 (1988), 1988.
De Bruyn Ouboter et al., "Multi-terminal SQUID controlled by the transport current", Physica B 205, pp. 153-162 (1995), 1995.
Feldman et al., "Josephson Junctions Digital Circuits", FED Report, Feb. 1998, 22 pages.
Gotz et al., "Harmonic current-phase relation in Nb-A1-based superconductor/ normal conductor/ superconductor-type Josephson junctions betWeen 4.2 K and the critical temperature", ApplPhys. Lett. 77, pp. 1354-1356 (2000).
Greenberg et al., "Low-frequency characterization of quantum tunneling in flux qubits", ArXiv.org preprint server: cond-mat/0208076, last accessed on Aug. 20, 2004.
Grover, "A fast quantum mechanical algorithm for database search", Proceedings of the 28th Annual ACM Symposium on the Theory of Computing, pp. 212-219 (1996).
Il'ichev et al., "Characterization of superconducting structures designed for qubit realizations", Appl. Phys. Lett. 80, pp. 4184-4186, 2002.
Il'ichev et al., "Degenerate Ground State in a Mesoscopic YBa2Cu3O7-x Grain Boundary Josephson Junction", Phys. Rev. Lett. 86, pp. 5369-5372, 2001.
Il'ichev et al., "Radio-frequency based monitoring of small supercurrents", Rev. Sci. Instrum. 72, pp. 1882-1887, 2001.
Il'ichev et al., "Radio-frequency method for characterization of superconducting weak links," Physica C 350, pp. 244-248, 2001.
Il'ichev et al., "Temperature dependence of the current-phase relation for YBa2Cu3O7-x step-edge Josephson junctions", App. Phys. Lett. 72, pp. 731-733, 1998.
Ioffe et al., "Environmentally decoupled sds-Wave Josephson junctions for quantum computing", Nature 398, pp. 679-681 (1999).
Jones et al., "Implementation of a quantum search algorithm on a quantum computer", Nature 393, pp. 344-346 (1998).
Jonker et al., "On quantum and classical computing with arrays of superconducting persistent current qubits", Proceedings fifth IEEE International workshop on computer architectures for machine perception, Padova, italy, 11-13 Spe 2000, pp. 69-78.
Ketchen, "Integrated Thin Film do-SQUID sensors", IEEE Transactions on Magnetics 23, pp. 1650-1657, 1987.
Kitaev et al., "Quantum measurements and the Abellan StabiliZer Problem", arXiv:quant-ph/9511026, pp. 1-22 (1995).
Knill et al., "Resilient Quantum Computation", Science 279, pp. 342-345 (1998).
Korotkov et al., "Charge Sensitivity of Radio-Frequency Single Electron Transistor", Appl. Phys Lett. 74, pp. 4052-4054 (1999).
Krech, "Linear Microwave Response of a Charge-Type Qubit", IEEE Trans. Appl. Supercond. 11, pp. 1022-1025, 2001.
Makhlin et al., "Nano-electronic circuits as quantum bits", ISACS 2000 Geneva. IEEE International Symposium on Circuits and Systems. Emerging Technologies of the 21st century Geneva, Switzerland, Mar. 28-32, 2000, pp. 241-244 vol. 2, Mar. 1, 2000.
Rey-de-Castro et al., "Design of an RSFQ Control Circuit to Observe MQC on an rf-SQUID", IEEE Transactions on Applied Superconductivity 11, pp. 1014-1017 (2001).
Rifkin et al., "rf SQUID's in the nonhysteretic mode: Detailed comparison of theory and experiment," J. App. Phys 47, pp. 2645-2650, 1976.

Schmidt et al., "Experimental investigations of the stationary behaviour of thin film double SQUIDS", Physica B&C Netherlands vol. 125B+C No. 2, Aug. 1984, pp. 185-198, Aug. 1, 1984.
Schoelkopf et al., "The Radio-Frequency Single-Electron Transistor (RF-SET): A Fast and Ultrasensitive Electrometer", Science 280, pp. 1238-1242 (1998).
Shor, "Polynominal-Time Algorithms for Prime Factorization and Discrete Logarithms on a Quantum Computer", SIAM Journal on Computing 26, pp. 1484-1509 (1997).
Silver et al., "Quantum States and Transitions in Weakly Connected Superconducting Rings", Phys. Rev 157, pp. 317-341, 1967.
Stolz et al., "LTS SQUID sensor with a new configuration," Supercon. Sci. Tech. 12, pp. 806-808, 1999.
Van der Wal et al., "Quantum Superposition of Macroscopic Persistent current states", Science 290, pp. 773-777, 2000.
Vandersypen et al., "Experimental realiZation of order-finding With a quantum computer", ArXiv.org:quant-ph/0007017, pp. 1-4 (2000).
Walraff et al., "Annular Long Josephson Junctions in a Magnetic Field: Engineering and Probing the Fluxon Interaction Potential", J. Low Temp. Phys. 118, pp. 543-553 (2000).
Xi et al., "Effects of Fields induced hole density modulation on normal state and superconducting transport in YBa2Cu3O7-x", Physical Review Letters, 68, pp. 1240-1243, 1992.
Zagoskin, "A scalable, tunable qubit, based on a clean DND or grain boundary D_D junction", Los Alamos National Laboratory preprint cond-mat/9903170, pp. 1-8, 1999.
Zahn, "Experimental Apparatus for the measurement if the quantum interferences of the critical current of DC-tunnel SQUIDs", Experimentelle technik der physik East Germany vol. 28, No. 2, 1980, pp. 163-168, 1980.
Zahn, "The critical current of the low damped DC-Squid", Experimentelle technik der physik East Germany vol. 31, No. 4, 1983, pp. 311-318, 1983.
Zhang et al., "Non-constant bias current for dc SQUID operation", Physica C 368, pp. 181-184, 2002.
Zhang et al., "Operation of high-temperature rf SQUID magnetometers using dielectric SrTiO3 resonators", App. Phys. Lett. 67, pp. 3183-3185, 1995.
Boothby et al., "Architectural considerations in the design of a third-generation superconducting quantum annealing processor", arXiv: 2108.02322v1, Aug. 2021, pp. 3-4; and figure 4.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
International Search Report and Written Opinion for PCT/US2022/081515 dated Jan. 18, 2024, 9 pages.
International Search Report and Written Opinion for PCT/US2023/073045 dated Jan. 9, 2024 in 9 pages.
Ko, et al., "A Novel Method for Correcting Device Parameter Mismatches in Josephsen Junction Circuits", IEEE Transitions on Applied Superconductivity, vol. 3, No. 1. Mar. 1993, 4 pages.
Watanabe, M. et al., "Resonance-Free Low-Pass Filters for the AC Josephson Voltage Standard," IEEE Transactions on Applied Superconductivity, 16(1), Mar. 2006, 5 pages.
Baust,, Characterization of Flux-driven Josephson Parametric Amplifiers, Diploma Thesis, Technische Universitat Munchen, Aug. 2010, 119 pages.
Bell et al., "Traveling Wave Parametric Amplifier based on a chain of Coupled Asymmetric SQUIDs", arXiv:1509.04573 [cond-mat.supr-con], Sep. 15, 2015.
Bell, et al., "SQUID Based Superconducting Traveling-Wave Parametric Amplifier", IEEE/CSC & ESAS Superconductivity News Forum (global edition), Oct. 2014, 3 pages.
Chamon, et al., "A superconducting circuit realization of combinatorial gauge symmetry", arXiv:2006.10060v1 [quant-ph] Jun. 17, 2020, 9 pages.
Chancellor et al., "Circuit design for multi-body interactions in superconducting quantum annealing systems with applications to a scalable architecture", arXiv:1603.09521v5, Oct. 13, 2017.
Christopher Eichler et al., 'Controlling the dynamic range of a Josephson parametric amplifier', EPJ Quantum Technology, vol. 1, No. 2, Jan. 29, 2014.

(56) References Cited

OTHER PUBLICATIONS

Devoret, "Josephson-based Parametric Amplifiers for Quantum Measurements", Quantum-Mechanical Electronics Lab, Applied Physics and Physics, Yale University, Nov. 2009, 92 pages.
Devoret, et al., "Introduction to Quantum-limited parametric Amplification of Quantum Signals with Josephson Circuits", arXiv:1605.00539v2, May 25, 2016, 28 pages.
Eddins, et al, "Josephson Parametric Amplifiers: Theory and Application", Quantum Nanoelectronics Laboratory, Department of Physics, University of CA, Berkley, Workshop on Microwave Cavity Design for Axion Detection Livermore Valley Open Campus, Aug. 2015.
Kitaev, "Fault-tolerant quantum computation by anyons", arXiv:quant-ph/9707021v1 Jul. 9, 1997, 27 pages.
Lechner et al., "A quantum annealing architecture with all-to-all connectivity from local interactions", Science Advances. Oct. 23, 2015. https://advances.sciencemag.org/content/1/9/e1500838.
Macklin, et al., "A near-quantum-limited Josephson traveling-wave parametric amplifier", Science Sciencemag. org,, Oct. 16, 2015 vol. 350, Issue 6258, 5 pages.
Puri, et al., "Quantum Annealing with All-to-all Connected Nonlinear Oscillators", Nature Communications, vol. 8, Article No. 15785, Jun. 8, 2017, 9 pages.
Sete, et al., "Purcell Effect with Microwave Drive: Suppression of Qubit Relaxation Rate", arXiv: 1401.5545v2, Mar. 21, 2014, 15 pages.
Simbierowicz, et al., "Flux-driven Josephson Parametric Amplifier for Sub-GHz Frequencies Fabricated with Side-wall Passivated Spacer Junction Technology", arXiv:1805.07307v1, May 18, 2018, 15 pages.
White et al., "Traveling wave parametric amplifier with Josephson junctions using minimal resonator phase matching", Applied Physics Letters 106, Jun. 15, 2015.
Zhao, et al. "Two-photon Driven Kerr Resonator for Quantum Annealing with Three-dimensional Circuit QED", arXiv:1712.03613v2, Dec. 12, 2017, 13 pages.
Zhou et al, "Experimental Realization of Spin Liquids in a Programmable Quantum Device", arXiv:2009.07853v2, 2020.
Amin et al., "Current Biased Josephson Junction System," U.S. Appl. No. 60/557,747, filed Mar. 29, 2004, 49 pages.
Amin et al., "Degenerate Level Qubit Operations", U.S. Appl. No. 60/429,170, filed Nov. 25, 2002, 41 pages.
Ataldes, et al., "the XZZX surface code", Nature Communications, https://doi.org/10.1038/s41467-021-22274-1,. 2021, 12 pages.
Augar et al., "Fault-tolerance thresholds for the surface code with fabrication errors", Phys. Rev. A 96 042316—Published Oct. 12, 2017, 4 pages.
Averin et al., "Variable Electrostatic Transformer: Controllable Coupling of Two Charge Qubits," Physical Review Letters 91(5): 057003-1-057003-4, Aug. 1, 2003.
Averin, D.V., "Adiabatic Quantum Computation with Cooper Pairs," arXiv:quant-ph/9706026v1, Jun. 13, 1997, 18 pages.
Barrett, et al., "Fault Tolerant Quantum Computation with Very High Threshold for Loss Errors", Phys. Rev. Lett. 105, 200502—Published Nov. 9, 2010, 4 pages.
Blais et al., "Tunable Coupling of Superconducting Qubits," arXiv:cond-mat/0207112v3 [cond-mat.mes-hall], Mar. 18, 2003, 4 pages.
Blatter et al., "Design aspects of superconducting-phase quantum bits," Physical Review B 63: 174511-1-174511-9, 2001.
Bocko et al., "Prospects for Quantum Coherent Computation Using Superconducting Electronics," IEEE Transactions on Applied Superconductivity 7(2):3638-3641, Jun. 1997.
Brown, et al., "A fault-tolerant non-Clifford gate for the surface code in two dimensions", Science Advances, May 22, 2020, vol. 6, Issue 21, 25 pages.
Calderbank, et al., "Good quantum error-correcting codes exist", Phys. Rev. A54, 1098—Published Aug. 1, 2996, 4 pages.
Clarke et al., "Superconducting quantum bits," Nature 453:1031-1042, Jun. 19, 2008.

Devoret et al., "Superconducting Circuits for Quantum Information: An Outlook," Science 339:1169-1174, Mar. 8, 2013.
Devoret et al., "Superconducting Qubits: A Short Review," arXiv:cond-mat/0411174v1, Nov. 7, 2004, 41 pages.
Feynman, "Simulating Physics with Computers," International Journal of Theoretical Physics 21(6/7): 467-488, 1982.
Fowler, et al., "Surface codes: towards practical large-scale quantum computation", Phys. Rev. A 86, 032324—Published Sep. 18, 2012, 5 pages.
Friedman et al., "Aharonov-Casher-Effect Suppression of Macroscopic Tunneling of Magnetic Flux," arXiv:cond-mat/0109544v1 [cond-mat.mes-hall], Sep. 28, 2001, 9 pages.
Friedman et al., "Quantum superposition of distinct macroscopic states," Nature 406:43-46, Jul. 6, 2000.
Grajcar et al. "Parametric Amplification for Quantum State Readout," U.S. Appl. No. 60/557,750, filed Mar. 29, 2004, 51 pages.
Harris et al., "Experimental Demonstration of a Robust and Scalable Flux Qubit," arXiv:0909.4321v1, Sep. 24, 2009, 20 pages.
Hilton et al., "Bus Architecture for Quantum Processing", U.S. Appl. No. 60/556,778, filed Mar. 26, 2004, 40 pages.
Horsman, et al., "Surface code quantum computing by lattice surgery", 2012 Journal of Physics, 14 123011, 28 pages.
Il'ichev et al., "Characterization and Measurement of Superconducting Structures", U.S. Appl. No. 60/341,974, filed Dec. 18, 2001, 22 pages.
Il'ichev et al., "Extra-Substrate Control System", U.S. Appl. No. 60/372,958, filed Apr. 15, 2002, 29 pages.
Johnson et al., "Scalable Control System for a Superconducting Adiabatic Quantum Optimization Processor," Superconductor Science & Technology (2010).
Knill, Fault-Tolerant Postselected Quantum Computation: Schemes, arXiv:quant-ph/0402171v1, Feb. 23, 2004, 17 pages.
Makhlin et al., "Quantum-state engineering with Josephson-junction devices," Reviews of Modern Physics 73(2):357-400, Apr. 2001.
Martinis, "Superconducting phase qubits," Quantum Inf Process 8:81-103, 2009.
Mooij et al., "Josephson Persistent-Current Qubit," Science 285:1036-1039, Aug. 13, 1999.
Naaman et al., "On-Chip Josephson Junction Microwave Switch," Northrop Grumman Systems Corp., Baltimore, Maryland, USA, Dec. 7, 2015, 10 pages.
Nagayama, et al., "Sureface code error correction on a defective lattice", IOP Publishing, New J. Phys. 19 (2017) 29 pages.
Non Final Office Action for U.S. Appl. No. 16/996,355, mailed Oct. 17, 2022, 12 pages.
Orlando et al., "Superconducting persistent-current qubit," Physical Review B 60(22):15398-15413, Dec. 1, 1999.
Tang, et al., "Robust surface code topology against sparse fabrication defects in a superconducting-qubit array", Phys Rev. A 93. 032322—Published Mar. 15, 2018, 4 pages.
Venegas-Andraca, et al., "A cross-disciplinary introduction to quantum annealing-base algorithms", Contemporary Physics, Quantum Annealing ArXiv:1803.03372v1 [puant-ph] Mar. 9, 2018, 31 pages.
Wendin et al., "Superconducting Quantum Circuits, Qubits and Computing," arXiv:cond-mat/0508729v1 [cond-mat.supr-con], Aug. 30, 2005, 60 pages.
Zagoskin et al., "Two-Junction Phase Qubit", U.S. Appl. No. 60/349,663, filed Jan. 15, 2002, 21 pages.
Zagoskin et al., "Superconducting Qubits," La Physique au Canada 63(4):215-227, 2007.
Born, et al., "Fabrication of Ultrasmall Tunnel Junctions by Electron Beam Direct-Writing", IEEE, 2001, 4 pages.
IL'ichev, et al., "Nonsinusoidal Current-Phase Relationship of Grain Boundary Josephson junctions in High-Tc Superconductors", Physical Review Letters 81, 1998, 4 pages.
Abrams et al., "A quantum algorithm providing exponential speed increase for finding eigenvalues and eigenvectors," arXiv:quant-ph/9807070v1, Jul. 24, 1998, 9 pages.
Abrams et al., "Simulation of Many-Body Fermi Systems on a Universal Quantum Computer," arXiv:quant-ph/9703054, Mar. 28, 1997, 10 pages.

(56) References Cited

OTHER PUBLICATIONS

Alange et al., "Superconducting Material Diagnostics using a scanning Near-field Microwave Microscope", Los Alamos National Laboratory pre-print cond-met/9811158, pp. 1-6, 1998.
Alff et al, "Magnetic Field Effect three terminal device based on YBs2Cu3O7-x grain boundary junction", Journal of Applied Physics, 75, pp. 1843-1845, 1944.
Barenco et al., "Elementary gates for quantum computation," Physical Review A 52(5):3457-3467, Nov. 1995.
Beasley et al., "Time-reversal Symmetry breaking in superconductors: A proposed Experimental test", Physical Review B, 49, pp. 12330-12332, 1994.
Berkley et al., "Systems and Methods for Operating a Quantum Processor to Determine Energy Eigenvalues of a Hamiltonian," U.S. Appl. No. 61/832,645, filed Jun. 7, 2013, 51 pages.
Blamonte et al., "Realizable Hamiltonians for universal adiabatic quantum computers," arXiv:0704.1287v2, Jun. 17, 2008, 7 pages.
Blais et al., "Operation of universal gates in a solid-state quantum computer based on clean Josephson junctions between d-wave superconductors", Physical Review A, 61, 042308, 2000.
Blatter et al., "Engineering Superconducting Phase Qubits", Los Alamos National Laboratory pre-print cond-met/9912163, 1999.
Bravyi et al., "The Complexity of Stoquastic Local Hamiltonian Problems," arXiv:quant-ph/0606140v4, Oct. 2, 2007 21 pages.
Chapman et al., "General Purpose Multiplexing Device for Cryogenic Microwave Systems," arXiv:1603.02716v2 [quant-ph] May 31, 2016, 10 pages.
Deutsch, "Quantum theory, the Church-Turing principle and the universal quantum computer," Appeared in Proceedings of the Royal Society of London A 400: 97-117, 1985.
Dimoulas et al., "Phase-dependent resistance in a superconductor two dimensional electron gas quasiparticle interferometer", Physical Review Letters, 74, pp. 602-605, 1995.
DiVincenzo, "The Physical Implementation of Quantum Computation," Fortschr. Phys. 48:771-783, 2000.
Flory et al., "Metallic and superconducting surfaces of YBa2Cu3O7 probrd by electrostatic charge modulation of epitaxial films", Physical Review Letters, 65, pp. 3441-3444, 1990.
Frey et al., "Mechanism of the electric field effect in the high to couprates", Physical Review B, 51, pp. 3257-3260, 1995.
Geim et al., "Ballistic Hall micromagnetometry", Applied Physics Letters, 71, pp. 2379-2381, 1997.
Han et al., "Time-Resolved Measurement of Dissipation-Induced Decoherence in a Josephson Junction," Science 293:1457-1459, Aug. 24, 2001.
Harris et al., "Universal Adiabatic Quantum Computing With Superconducting Qubits," U.S. Appl. No. 61/894,267, filed Oct. 22, 2013, 44 pages.
Hartog et al., "Transport in Multiterminal Normal Superconductor Devices: reciprocity relations, Negative and nonlocal resistances, and reentrance of the Proximity Effect", Physical Review Letters, 77, pp. 4954-4957, 1996.
International Search Report & Written Opinion (PCT/US2020/065150)—Apr. 13, 2021.
Ivanov et al., "Field effect transistor based on a bi-crystal boundary Josephson Junction", IEEE Transactions on Applied Superconductivity, 3, pp. 2925-2928, 1993.
Ivanov et al., "Three terminal Josephson Junction with a Semiconductor Accumulation Layer", Japanese Journal of Applied Physics, 26, supplement 3, pp. 1617, 1987.
James et al., "Scanning Hall probe Microscope images of Field penetration into niobium fields", Physica C 332, pp. 445-449, 2000.
Jiang et al., "New FET using the superconducting phase transition of a high temperature oxide superconductor", Superconductor Science and Technology, 4, pp. 466-470, 1991.
Jones et al., Tunable electromagnetic environment for supercomputing, Jun. 13, 2013, Scientific Reports, pp. 1-5 (Year:2013).
Kirtley et al., "Direct Imaging of Integer and Half-Integer Josephson Junction Vortices in High to Grain Boundaries", Physical Review Letters, 76, pp. 1336-1339, 1996.
Lombardi et al., "Transport and structural properties of the top and bottom grain boundaries on YBa2Cu3O7 step edge Josephson Junctions", Applied Physics Letters, 72, pp. 249-251, 1998.
Mannhart et al., "Anomalous dependence of the critical current of 45 grain boundaries in YBa2Cu3O7-x on an applied magnetic field", Zeitschrift fur Physik B, 101, pp. 175-179, 1996.
Mannhart et al., "High-To transistors", Superconductor Science and Technology, 9, pp. 49-67, 1996.
Mannhart et al., "Influence of electric fields on pinning in YBa2Cu3O7 films", Physical Review Letters, 67, pp. 2099-2101, 1991.
Mannhart et al., "Large electric field effetos in YBa2Cu3O7 films containing weak links", Applied Physics letters, 62, pp. 630-632, 1992.
Martinis et al., "Rabi Oscillations in a Large Josephson-Junction Qubit," Physical Review Letters 89(11):117901-1-117901-4, Sep. 9, 2002.
Nakajima et al., "Field Effects on the dielectric property of YBCO bicrystal grain boundary junctions", IEEE Transactions on Applied Superconductivity, 5, pp. 2861-2863, 1995.
Nakamura et al., "Coherent control of macroscopic quantum states in a single-Cooper-pair-box," Nature 398:786-788, Apr. 29, 1999.
Oral et al., "Microscopic measurements of penetration depth in YBa2Cu3O7-d thin films by scanning Hall probe microscopy", Superconductor Science and Technology 10, pp. 17-20, 1997.
Oral et al., "Real time scanning Hall probe microscopy", Applied Physics Letters, pp. 1324-1326, 1996.
Pechal et al., "Superconducting Switch for Fast On-Chip Routing of Quantum Microwave Fields," arXiv:1606.01031v1 [quant-ph] Jun. 3, 2016, 8 pages.
Tsuei et al., "Pairing symmetry in flux quantization in a tricrystal superconducting ring Yba2Cu3O7-delta", Physical Review Letters, 73, pp. 593-596, 1994.
Tzalenchuk et al., "SQUID and Hall-probe microscopy of superconducting films", IOP conference series 167, pp. 581-584, 2000.

* cited by examiner

TOPOLOGICALLY PROTECTED QUBITS, PROCESSORS WITH TOPOLOGICALLY PROTECTED QUBITS, AND METHODS FOR USE OF TOPOLOGICALLY PROTECTED QUBITS

FIELD

This disclosure generally relates to devices and architectures for quantum processing with quantum devices, and in particular, to error correction for qubits and processors with and methods for using error corrected qubits.

BACKGROUND

Quantum Devices

Quantum devices are structures in which quantum mechanical effects are observable. Quantum devices include circuits in which current transport is dominated by quantum mechanical effects. Such devices include spintronics, and superconducting circuits. Both spin and superconductivity are quantum mechanical phenomena. Quantum devices can be used for measurement instruments, in computing machinery, and the like.

Quantum Computation

A quantum computer is a system that makes direct use of at least one quantum-mechanical phenomenon, such as, superposition, tunneling, and entanglement, to perform operations on data. The elements of a quantum computer are qubits. Quantum computers can provide speedup for certain classes of computational problems such as computational problems simulating quantum physics.

Superconducting Qubits

Superconducting qubits are solid state qubits based on circuits of superconducting materials. Operation of superconducting qubits is based on the underlying principles of magnetic flux quantization, and Josephson tunneling. Superconducting effects can be present in different configurations and can give rise to different types of superconducting qubits including flux, phase, charge, and hybrid qubits. The different configurations can vary in the topology of the loops, the placement of the Josephson junctions, and the physical parameters of elements of the superconducting circuits, such as inductance, capacitance, and Josephson junction critical current.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

In one implementation, the superconducting qubit includes a superconducting loop interrupted by a Josephson junction. The ratio of the inductance of the Josephson junction to the geometric inductance of the superconducting loop can be expressed as $2\pi L I_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

Circuit Model Quantum Computing

The quantum circuit model of computation uses quantum logic gates to form quantum circuits for problem solving. A network of quantum logic gates may be formed to describe a particular computation.

One type of quantum circuit model quantum computation is referred to as surface code, with logical qubits being simultaneously stored and manipulated as topological defects. In surface code there is no fixed Hamiltonian to restrict the subspace. Instead, each term in the Hamiltonian is treated as a stabilizer and by projective measurements of the stabilizers, the protected subspace is enforced and any leakage from the subspace is detected as an error and corrected.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

Qubits in a quantum processor may experience noise due to external processes that may result in the qubit coupling to the environment and computations performed on the quantum processor yielding results that are less accurate or less optimal. As discussed herein, logical qubits may be provided from physical qubits coupled by parity enforcing couplers. The use of even or odd parity enforcing couplers allow for the creation of degeneracy within the system, which creates superposition of states and reduces the sensitivity of the physical qubits to noise. Creating qubit states that are insensitive to noise may beneficially allow for improved computation results.

According to an aspect, there is provided a logical qubit comprising a first tunable coupler, a second tunable coupler, a plurality of fixed couplers comprising at least a first fixed coupler and a second fixed coupler, wherein each of the first tunable coupler, the plurality of fixed couplers, and the second tunable coupler enforce one of even and odd parity in any connected qubits, a plurality of physical qubits comprising a first set of two or more qubits connected to the first tunable coupler, at least one of the qubits in the first set of two or more qubits connected to the first fixed coupler, a second set of two or more qubits connected to the second tunable coupler, at least one of the qubits in the second set of two or more qubits connected to the second fixed coupler, and a third set of two or more qubits connected between the first fixed coupler and the second fixed coupler, and wherein each coupler in the plurality of fixed couplers is connected to at least two qubits in the plurality of physical qubits, at least one coupler of the plurality of fixed couplers is in communication with four qubits and providing interaction between the four qubits, and wherein at least two discrete qubit paths connect the first tunable coupler and the second tunable coupler and the first tunable coupler, the second tunable coupler, the plurality of fixed couplers, and the plurality of physical qubits define a lattice.

According to other aspects, each of the first tunable coupler and the second tunable coupler may be connected to an external qubit, the external qubit may comprise an additional physical qubit connected on an outer perimeter of the lattice, and each external qubit may be in communication with one or more additional logical qubits. The plurality of physical qubits may comprise pairs of qubits arranged in loops made up of two qubits of the plurality of physical qubits, the pairs of qubits coupled by two couplers of the first tunable coupler, the second tunable coupler, and the plurality of fixed couplers, the plurality of fixed couplers may each be respective four qubit parity enforcers and the first tunable coupler and the second tunable coupler are each respective switchable three qubit parity enforcers, the plurality of physical qubits comprise twenty four physical qubits arranged in a three-by-three square lattice, the first and the second tunable couplers may be positioned on diagonally opposite corners of the three-by-three square lattice, the first and the second tunable couplers may be positioned on first and the second exterior sides of the three-by-three square lattice, the first and the second tunable couplers may be positioned on an interior of the three-by-three lattice, the logical qubit may further comprise a control signal source coupled to apply a control signal to change a state of one or more qubits in communication with one of the at least two discrete qubit paths, and the control signal source may comprise a microwave line.

According to an aspect, there is provided a quantum processor comprising a plurality of logical qubits, each logical qubit comprising a first tunable coupler, a second tunable coupler, a plurality of fixed couplers comprising at least a first fixed coupler and a second fixed coupler, wherein each of the first tunable coupler, the plurality of fixed couplers, and the second tunable coupler enforce parity in any connected qubits, a plurality of physical qubits comprising a first set of two or more qubits connected to the first tunable coupler, at least one of the qubits in the first set of two or more qubits connected to the first fixed coupler, a second set of two or more qubits connected to the second tunable coupler, at least one of the qubits in the second set of two or more qubits connected to the second fixed coupler, and a third set of two or more qubits connected between the first fixed coupler and the second fixed coupler, wherein each coupler in the plurality of fixed couplers is connected to at least two qubits in the plurality of physical qubits, at least one coupler of the plurality of fixed couplers is in communication with four qubits and providing interaction between the four qubits, and wherein at least two discrete qubit paths connect the first tunable coupler and the second tunable coupler and the first tunable coupler, the second tunable coupler, the plurality of fixed couplers, and the plurality of physical qubits define a lattice, and wherein each logical qubit of the plurality of logical qubits is communicatively coupled to at least one other logical qubit of the plurality of logical qubits.

According to other aspects, the coupled logical qubits may be connected by two physical qubits and an intermediate coupler, the coupled logical qubits may be connected by one shared physical qubit, the coupled logical qubits may be directly coupled with a tunable four qubit coupler by sharing a tunable coupler, multiple logical qubits may be coupled by physical qubits connected to an intermediate coupler, four logical qubits may be coupled by four external qubits and an intermediate tunable four qubit coupler, each external qubit may comprise an additional physical qubit connected on an outer perimeter of the lattice, the four logical qubits may be coupled by a single shared qubit, a control signal source may be communicatively coupled to change a state of one or more qubits in communication with one of the at least two discrete qubit paths, and the control signal source may comprise=a microwave line.

According to an aspect, there is provided a method of performing a logical X operation on a logical qubit as described herein, the method comprising applying a bias signal to one or both external qubits to initialize the logical qubit, turning off one or more of the tunable couplers, applying a control signal to all qubits along a path connecting the first and second tunable couplers, the control signal configured to induce a transition between two logical states, and reading out the logical qubit by measuring a state of one of the external qubits.

According to other aspects, the method may further comprise communicatively coupling the logical qubit to one or more other logical qubits by turning on a corresponding coupler prior to applying the control signal, initializing the logical qubit may comprise initializing a plurality of logical qubits, applying a control signal may comprise applying a plurality of control signals, and reading out the logical qubit may comprise reading out the plurality of logical qubits. Applying a control signal to all qubits along a path connecting the first and second tunable couplers may comprise applying a microwave signal through a microwave line communicatively coupled to all qubits along a path connecting the first and second tunable couplers, the microwave signal comprising a frequency that is in resonance with an energy gap between a ground state and an excited state that has overlap with two logical states to induce a transition between the two logical states and applying a microwave signal may comprise flipping all of the physical qubits on the path connecting the first and second tunable couplers by applying a microwave signal simultaneously to all qubits along the path connecting the first and second tunable couplers.

According to an aspect, there is provided a method of performing a logical Z operation on a logical qubit as described herein, the method comprising determining a phase difference to be applied to the logical qubit, applying a control signal to activate the first tunable coupler, applying a bias signal to the external qubit in communication with the first tunable coupler, and tuning a duration and a magnitude of the bias signal to achieve the determined phase difference in the logical qubit.

According to other aspects, activating the first tunable coupler may comprise activating the first tunable coupler and the second tunable coupler and applying a bias signal to the external qubit in communication with the first tunable coupler may comprise applying a bias signal to each of the external qubit in communication with the first tunable coupler and the external qubit in communication with the second tunable coupler.

In other aspects, the features described above may be combined together in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, quantum processors, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Example Computing System

Figure 1:
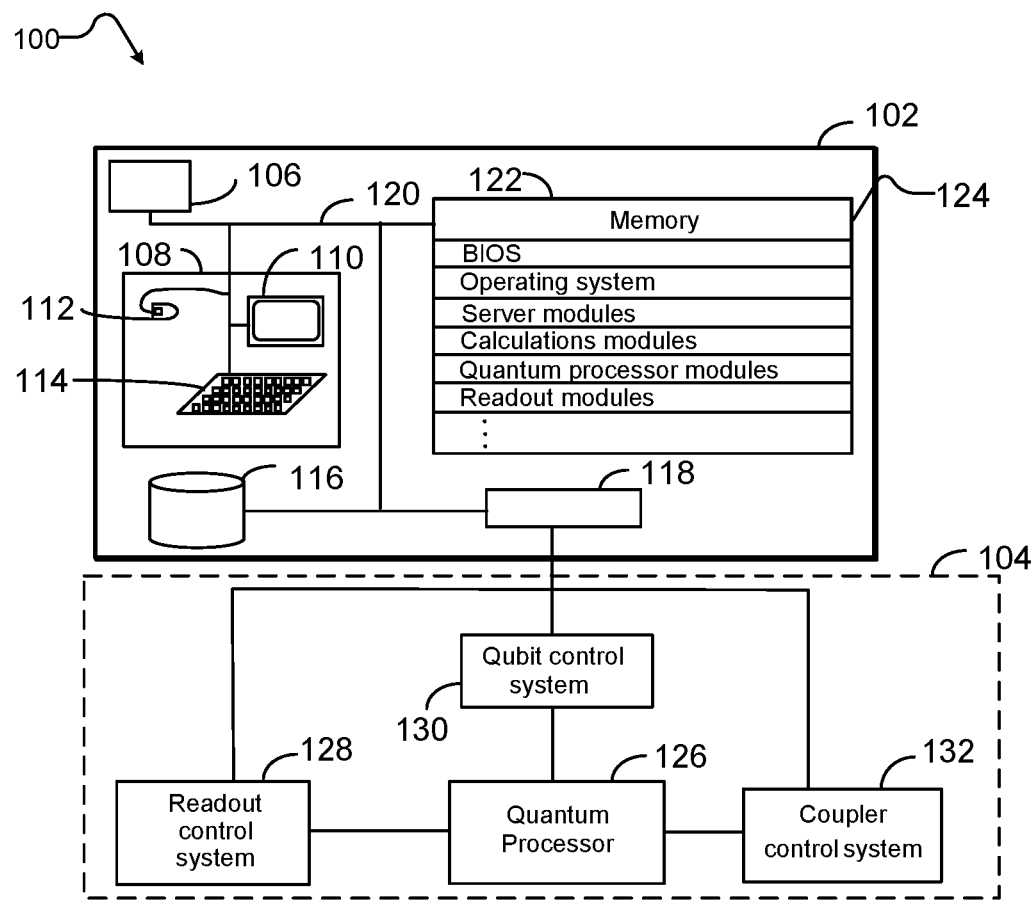
FIG. 1 is a schematic diagram of a hybrid computing system including a digital computer coupled to an analog computer, in accordance with the present systems, devices, and methods.

FIG. 1 illustrates a computing system 100 comprising a digital computer 102.

The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory or a solid-state disk that employs integrated circuits to provide non-volatile memory.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute various algorithms. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104. For example, the system memory 122 may store processor- or computer-readable instructions, data structures, or other data which, when executed by a processor or computer causes the processor(s) or computer(s) to execute one, more or all of the acts of method 900 or method 1000 of FIG. 9 and FIG. 10, respectively.

Analog computer 104 may include at least one analog processor such as a quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices (also referred to herein as controllable devices). Qubits may be read out via a readout control system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines. Programmable elements may be included in quantum processor 126 in the form of an integrated circuit.

Example Superconducting Quantum Processor

Figure 2:
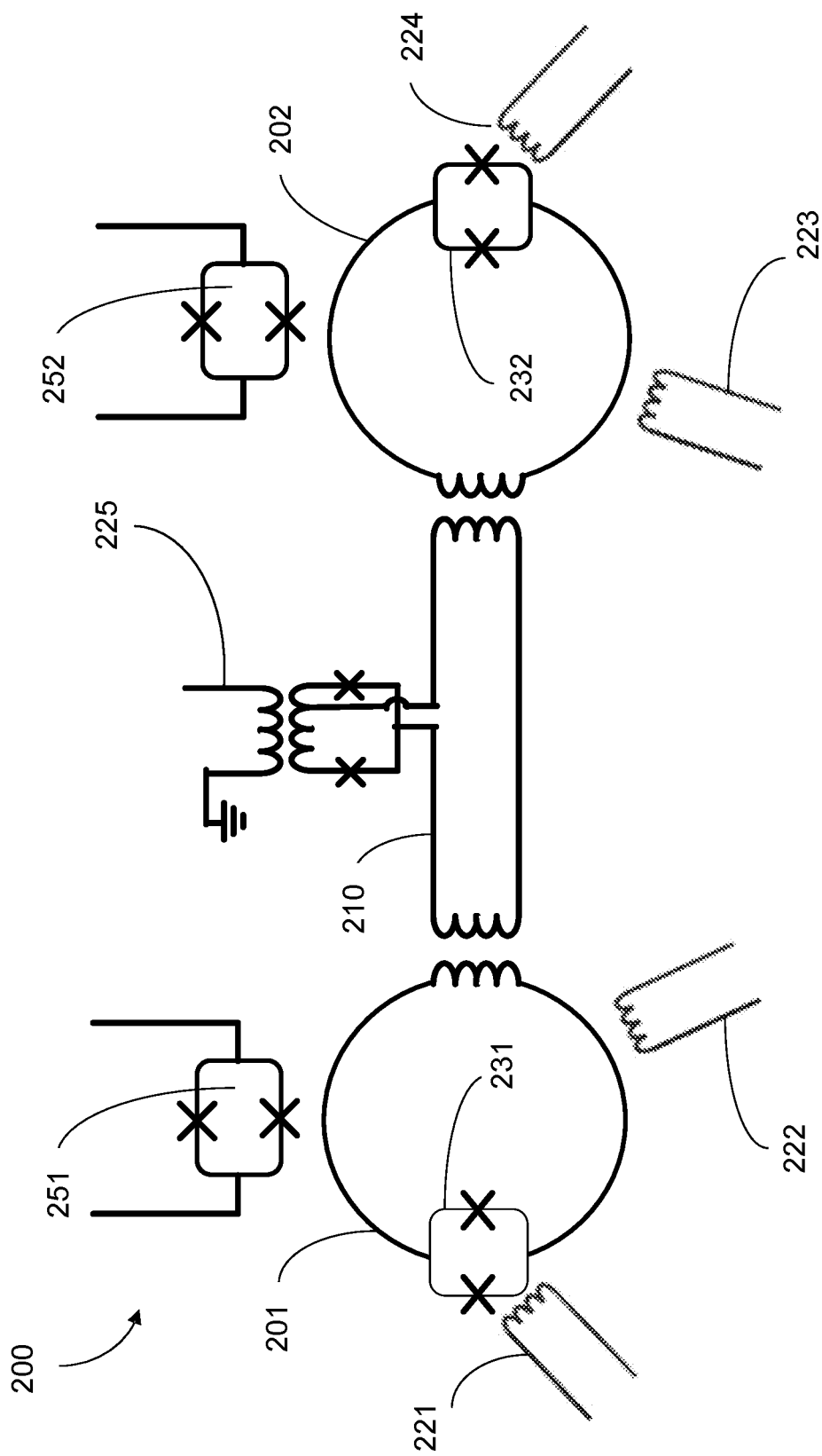
FIG. 2 is a schematic diagram of a portion of an exemplary superconducting quantum processor.

FIG. 2 is a schematic diagram of a portion of an example of a superconducting quantum processor 200, according to at least one implementation. The portion of superconducting quantum processor 200 shown in FIG. 2 includes two superconducting qubits 201 and 202. Also shown is a tunable coupling (diagonal coupling) via a coupler 210 between qubits 201 and 202 (i.e., providing two local interaction). While the portion of quantum processor 200 shown in FIG. 2 includes only two qubits 201, 202 and one coupler 210, those of skill in the art will appreciate that quantum processor 200 may include any number of qubits and any number of couplers coupling information between them.

Quantum processor 200 includes a plurality of interfaces 221, 222, 223, 224, 225 that are used to configure and control the state of quantum processor 200. Each of interfaces 221-225 may be realized by a respective inductive coupling structure, as illustrated, as part of a programming subsystem and/or an evolution subsystem. Alternatively, or in addition, interfaces 221-225 may be realized by a galvanic coupling structure. In some implementations, one or more of interfaces 221-225 may be driven by one or more DACs. Such a programming subsystem and/or evolution subsystem may be separate from quantum processor 200, or may be included locally (i.e., on-chip with quantum processor 200).

In the operation of quantum processor 200, interfaces 221 and 224 may each be used to couple a flux signal into a respective compound Josephson junction (CJJ) 231 and 232 of qubits 201 and 202, thereby realizing a tunable tunneling term (the $\Delta_i$ term) in the system Hamiltonian. This coupling provides the off-diagonal $\sigma^x$ terms of the Hamiltonian and these flux signals are examples of "delocalization signals". Examples of Hamiltonians (and their terms) used in quantum computing are described in greater detail in, for example, U.S. Patent Application Publication No. 2014/0344322, now granted as U.S. Pat. No. 9,424,526.

Similarly, interfaces 222 and 223 may each be used to apply a flux signal into a respective qubit loop of qubits 201 and 202, thereby realizing the $h_i$ terms (dimensionless local fields for the qubits) in the system Hamiltonian. This coupling provides the diagonal $\sigma^z$ terms in the system Hamiltonian. Furthermore, interface 225 may be used to couple a flux signal into coupler 210, thereby realizing the $J_{ij}$ term(s) (dimensionless local fields for the couplers) in the system Hamiltonian. This coupling provides the diagonal $\sigma_i^z \sigma_j^z$ terms in the system Hamiltonian.

While FIG. 2 illustrates only two physical qubits 201, 202, one coupler 210, and two readout devices 251, 252, a quantum processor (e.g., processor 200) may employ any number of qubits, couplers, and/or readout devices, including a larger number (e.g., hundreds, thousands or more) of qubits, couplers and/or readout devices. Examples of superconducting qubits include superconducting flux qubits, superconducting charge qubits, and the like. In a superconducting flux qubit, the Josephson energy dominates or is equal to the charging energy. In a charge qubit this is reversed. Examples of flux qubits that may be used include radio frequency superconducting quantum interference devices, which include a superconducting loop interrupted by one Josephson junction, persistent current qubits, which include a superconducting loop interrupted by three Josephson junctions, and the like.

Toric Code

Topological protection refers to the use of an arrangement of components within a quantum processor to beneficially reinforce those components against the influence of the external environment. Topological protection may allow for high coherence and a low level of error in quantum computation to be achieved. The toric code described in A. Y. Kitaev, *Fault-tolerant quantum computation by anyons*, Ann. Phys. 303, 2-30 (2003) (herein "Kitaev") describes one implementation for achieving topological protection. In Kitaev, qubits are connected via four qubit couplers in both X and Z bases, which may make implementation challenging, in particular, with respect to implementation using superconducting qubits. An implementation of toric code with superconducting qubits is described in Chamon et al. (C. Chamon and D. Green, *A superconducting circuit realization of combinatorial gauge symmetry*, arXiv: 2006.10060, herein "Chamon") and experimentally explored by Zhou et al. (Shiyu Zhou, Dmitry Green, Edward D. Dahl, and Claudio Chamon, *Experimental Realization of Spin Liquids in a Programmable Quantum Device*, arXiv: 2009.07853, herein "Zhou").

In the toric code, logical qubits are introduced by creating defects in both Z and X bases. Single qubit (Clifford) operations are implemented by controlled X and Z operations on certain physical qubits, and two qubit C-NOT operations are implemented by braiding. Non-Clifford operations may also be implemented. Surface code may be implemented by a circuit or gate model quantum computer. In surface code there is no fixed Hamiltonian to restrict the subspace. Instead, each term in the Hamiltonian is treated as a stabilizer and by projective measurements of the stabilizers, the protected subspace is enforced and any leakage from the subspace is detected as an error and corrected.

In the implementations of Chamon and Zhou, although a protective Hamiltonian is present as required in toric code, individual controls over X and Z operations and four qubit X-couplers is challenging. Therefore, quantum computation as introduced in Kitaev is challenging. In the surface code, on the other hand, while all the manipulations are possible via gate operations, the protective Hamiltonian does not exist, therefore such typically employs significant error correction.

Topologically Protected Qubit

In the implementation of Zhou discussed above, four qubit Z-coupling is achieved via ancilla qubits, and four qubit X-coupling is obtained via high order perturbation of the single qubit tunneling amplitudes. While the low energy Hamiltonian in this implementation is expected to have the correct form, the gap will be extremely small due to the high order of perturbation. Removing the ancilla qubits by directly implementing a four qubit Z-coupler reduces the order of perturbation to 4, which can lead to an energy gap becoming larger than the temperature of the quantum processor if the single qubit tunneling amplitudes are large enough. An energy gap larger than the temperature of the processor may result in a significantly increased likelihood of transitions out of the ground state to an excited state, resulting in errors in computation or failures to find solutions. In the implementations of Chamon and Zhou, four ancilla qubits are used to implement the four qubit interaction. A four qubit coupler with 4 ancilla qubits was also proposed in Nicholas Chancellor, Stefan Zohren, Paul A. Warburton, *Circuit design for multi-body interactions in superconducting quantum annealing system with applications to a scalable architecture*, npj Quantum Information 3, Article number: 21 (2017), arXiv:1603.09521.

As discussed in further detail herein, logical qubits may be used as quantum memories to act as physical qubits in error corrected quantum algorithms such as surface code. As used herein, a logical qubit refers to a qubit that is used for problem solving, typically formed from one or more physical qubits. For example, in some implementations, a logical qubit may be formed from two physical qubits and a coupler coupling those two physical qubits. In other implementations, a logical qubit may include a number of physical qubits coupled together to reduce the susceptibility of the quantum processor to noise. A Hamiltonian protected logical qubit may be used as a quantum memory, which can be used as a single physical element (i.e., a physical qubit) in a fault-tolerant gate model quantum computation setting such as surface code. It is discussed herein how to initialize, manipulate, and read out these qubits.

Figure 3A:
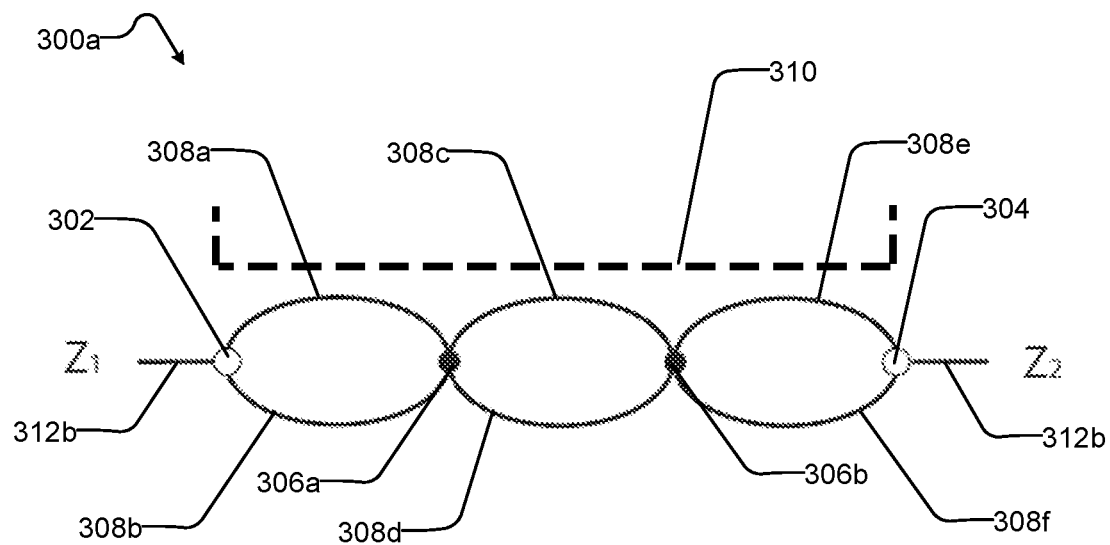
FIG. 3A is a schematic diagram of a logical qubit with two physical qubit plaquettes.

FIGS. 3A through 5B are example implementations of topologically protected logical qubits. Referring to FIG. 3A, logical qubit 300a has a first tunable coupler 302, a second tunable coupler 304, and a plurality of fixed couplers 306a and 306b including first fixed coupler 306a and second fixed coupler 306b. As used herein, "tunable coupler" refers to a coupler having an adjustable coupling strength that may, for example, be controlled by a control line coupled to the coupler. The control line may apply a signal to the coupler to change the coupling strength as required. In contrast, a "fixed coupler" as discussed herein refers to a coupler having a fixed coupling strength that is determined by the physical properties of the coupler and is not varied during operations on the quantum processor. In the example implementation of FIG. 3A, fixed couplers 306a and 306b are configured to provide four qubit interaction. In other implementations, such as the example implementation of FIG. 4, discussed in further detail below, some of the fixed couplers may be configured to provide three qubit interaction (e.g., 406a, 406c) with at least one of the plurality of fixed couplers configured to provide four qubit interaction (e.g., 406f). Each of first tunable coupler 302, plurality of fixed couplers 306a, 306b, and second tunable coupler 304 enforce even parity in any connected qubits.

Even parity refers to a coupler that defines one state where an even number of qubits are in a given state, and a second penalized state where an odd number of qubits are in a given state. Providing parity enforcing couplers in the circuits described herein allows for the formation of degenerate states, with each state having even numbers of qubits in a given state having the same energy, and each state having odd numbers of qubits in a given state having a different energy. An example implementation is provided in FIG. 8 and discussed below. A parity enforcing coupler is any coupler that is coupled such that the overall energy state of the system has two levels, one when all of the connected qubits have an even number of qubits in a given state, and one when all of the connected qubits have an odd number of qubits in a given state. Aside from these two different energy levels, parity enforcing couplers are agnostic to the actual number of qubits in each state, which produces degenerate states. It will be understood that the definition of the states of a qubit is arbitrary, and these states may be thought of interchangeably as "0" and "1", "−1" and "+1", or "spin up" and "spin down" in different contexts. As there is freedom in defining what constitutes the two states for each physical qubit, the definition of even and odd parity is arbitrary. However, this definition, once fixed for a particular implementation, is kept throughout the computation process.

For example, if the qubit states are labeled as "+1" and "−1", an even parity enforcer with three coupled qubits (e.g., coupler 406d) would favor the "+1,+1,+1", "+1,−1,−", "1,+1,−1", and "−1,−1,+1" states, as all of these states have even numbers of qubits in the −1 state. It will be understood from this example that if the labels were reversed, the same coupler may then be considered an odd parity enforcer. It will also be understood that in some cases, the qubits may have degenerate states, or the favored state may be a ground state. International Patent Application No. PCT/US2021/024134, now published as WO 2021/195368 for a further discussion of parity stabilizers.

Figure 8:
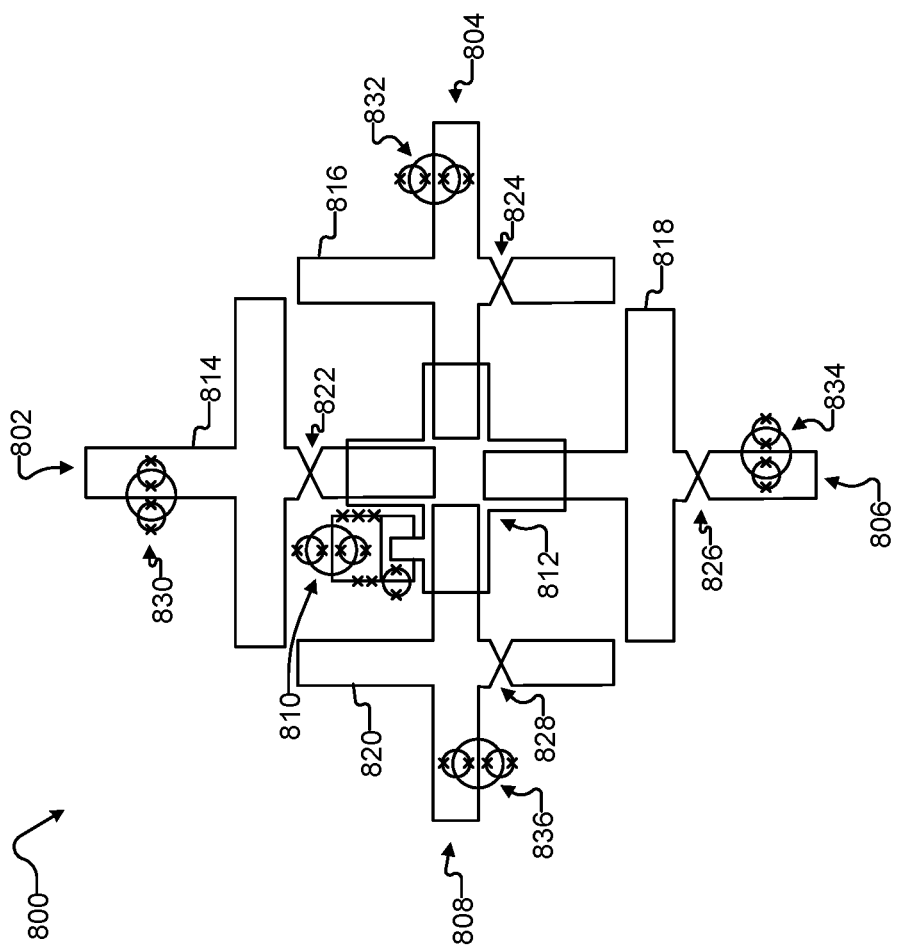
FIG. 8 is a schematic diagram of a circuit including a four qubit even-parity coupler.

The presence of degenerate states in the circuits created by parity stabilization as described herein allows for the creation of superposition and protection of the qubits from noise. The example implementation of a coupler described with respect to FIG. 8 is one example of an even parity enforcer. However, it will be understood that an odd parity enforcer may also be used to enforce even parity based on the definitions used, as discussed above. For example, in some implementations, an odd parity enforcer can be used as an even parity enforcer by redefining the logical state of one of the qubits coupled to it, i.e., change Z=1 to Z=−1 or vice versa. Defining the states allows for an odd parity enforcer to effectively behave as an even parity enforcer and enforce even parity in any connected qubits.

A plurality of physical qubits 308a, 308b, 308c, 308d, 308e, 308f (collectively 308) form part of logical qubit 300a. In FIG. 3A and the following figures, physical qubits are represented schematically as edges and couplers are represented schematically as nodes. However, it will be understood that the qubits are typically a loop interrupted by a Josephson junction, and the couplers typically have a more complex structure as discussed in further detail below. As discussed throughout this application, physical qubits such as physical qubits 308 may be superconducting qubits similar to qubits 201 and 202 discussed above. In other implementations, physical qubits may be other types of flux qubits, such as fluxonium qubits. Physical qubits may be qubits as described in U.S. Provisional Patent Application No. 63/223,686. A first set of qubits (308a, 308b) from the plurality of physical qubits are connected to first tunable coupler 302 and first fixed coupler 306a. A second set of qubits (308e, 308f) are connected to second tunable coupler 304 and second fixed coupler 306b. A third set of qubits are connected between first fixed coupler 306a and second fixed coupler 306b. Two discrete qubit paths (308a, 308c, 308e and 308b, 308d, 308f) connect first tunable coupler 302 and second tunable coupler 304. It will be understood that other paths may be formed with a different placement of a microwave line 310. The path may pass through qubits on either side of logical qubit 300a where wiring is provided to apply a signal on both sides of logical qubit 300a. Microwave line 310 is in communication with the qubit path 308a, 308c, 308e. Logical qubit 300a may have first tunable coupler 302 and second tunable coupler 304 connected to external qubits 312a and 312b also schematically represented as a line or edge and typically having the form of a loop interrupted by a Josephson junction, and external qubits 312a and 312b may communicate with additional logical qubits, as is discussed in more detail below.

Figure 3B:
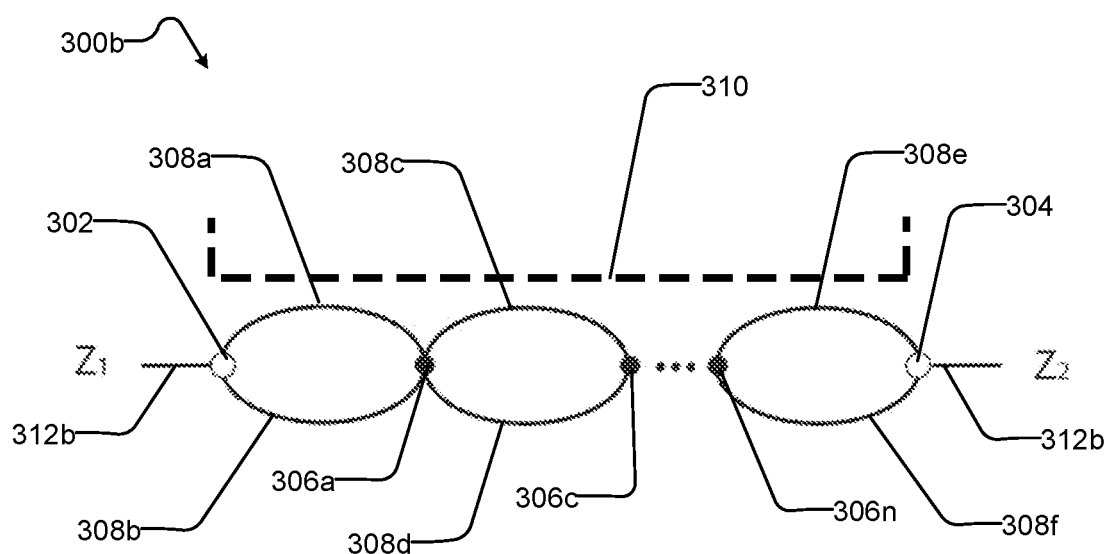
FIG. 3B is a schematic diagram of a logical qubit with two physical qubit plaquettes having indeterminate length.

Referring to FIG. 3B, where like elements to those in FIG. 3A have like reference numbers, a logical qubit 300b is shown. The plurality of physical qubits and the number of fixed couplers may be varied to vary a length of logical qubit 300b. Additional fixed couplers such as 306n and additional pairs of physical qubits may be added to increase the length. In the implementations of FIGS. 3A and 3B, fixed couplers 306 are four qubit parity enforcers and first and second tunable couplers 302, 304 are switchable three qubit parity enforcers. The plurality of physical qubits 308 in logical qubits 300a and 300b are made up of pairs of physical qubits arranged in loops, with the loops being made up of the pair of physical qubits and two couplers selected from first tunable coupler 302, second tunable coupler 304, and plurality of fixed couplers 306a, 306b, 306c (collectively 306).

Figure 4:
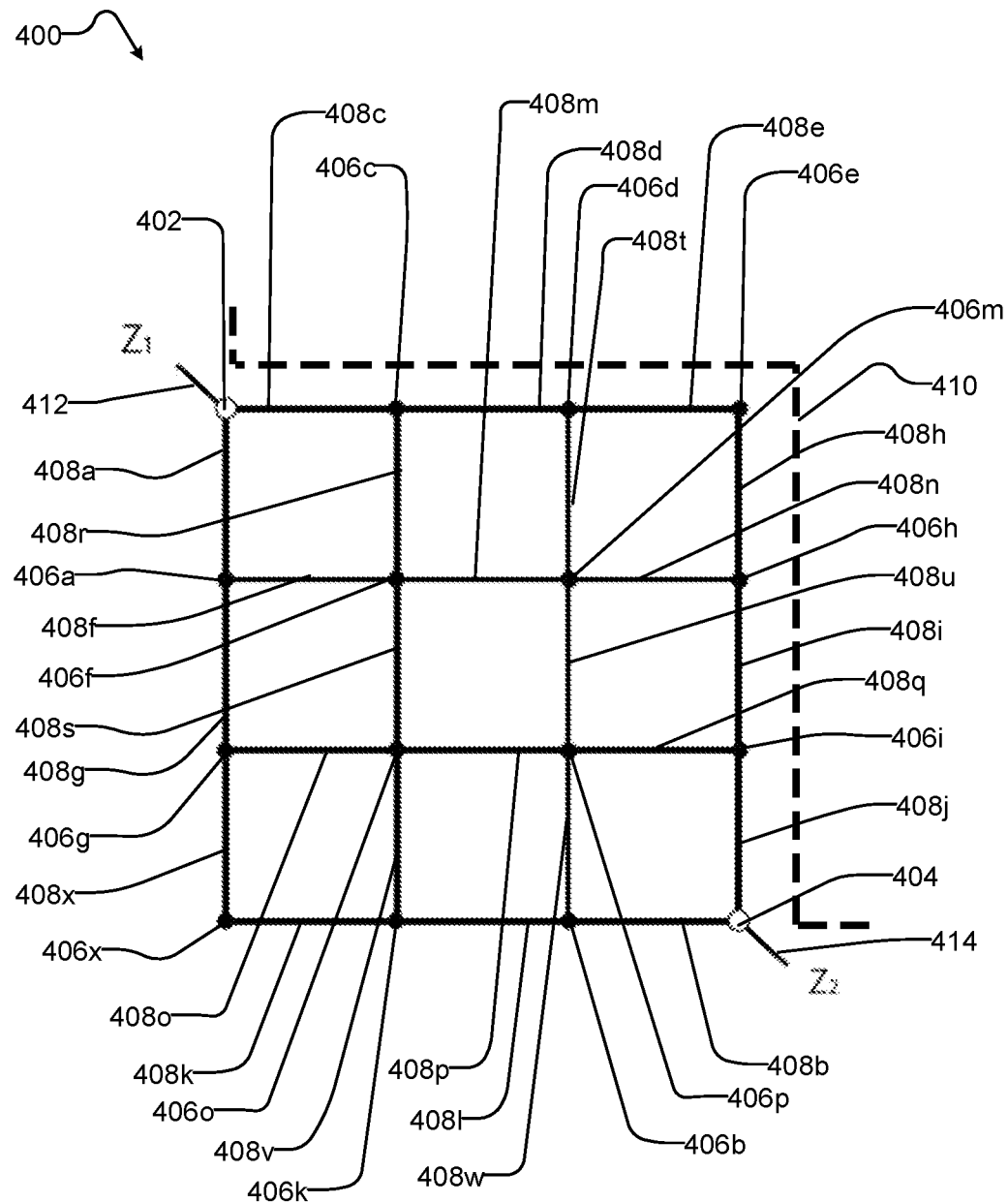
FIG. 4 is a schematic diagram of a logical qubit with a three-by-three square lattice and tunable couplers on diagonally opposite corners.

Referring to FIG. 4, in some implementations a logical qubit 400 may have a two-dimensional structure of first and second tunable couplers 402, 404, a plurality of fixed couplers (406a, 406b, 406c, 406d, 406e, 406f, 406m, 406h, 406i, 406g, 406p, 406o, 406k, 406x, collectively 406) and physical qubits (408a 408b, 408c, 408d, 408e, 408f, 408g, 408h, 408i, 408j, 408k, 408l, 408m, 408n, 408o, 408p, 408q, 408r, 408s, 408t, 408u, 408v, 408w, 408x, collectively 408). In logical qubit 400 twenty-four physical qubits 408 are arranged in a three-by-three square lattice. Fixed couplers 406f, 406m, 406o and 406p provide for four qubit interaction, while fixed couplers 406e and 406x provide two qubit interaction, and fixed couplers 406a, 406b, 406c, 406d, 406g, 406h, 406i, and 406k provide three qubit interaction. First and second tunable couplers 402, 404 and fixed couplers 406 enforce even parity (or odd parity, as discussed above) in any connected qubits. Multiple qubit paths connect first tunable coupler 402 with second tunable coupler 404, and a microwave line 410 is connected along one qubit path (408c, 408d, 408e, 408h, 408i, 408j). Logical qubit 400 may have external qubits 412 and 414, which may be in communication with one or more additional logical qubits.

Figure 5A:
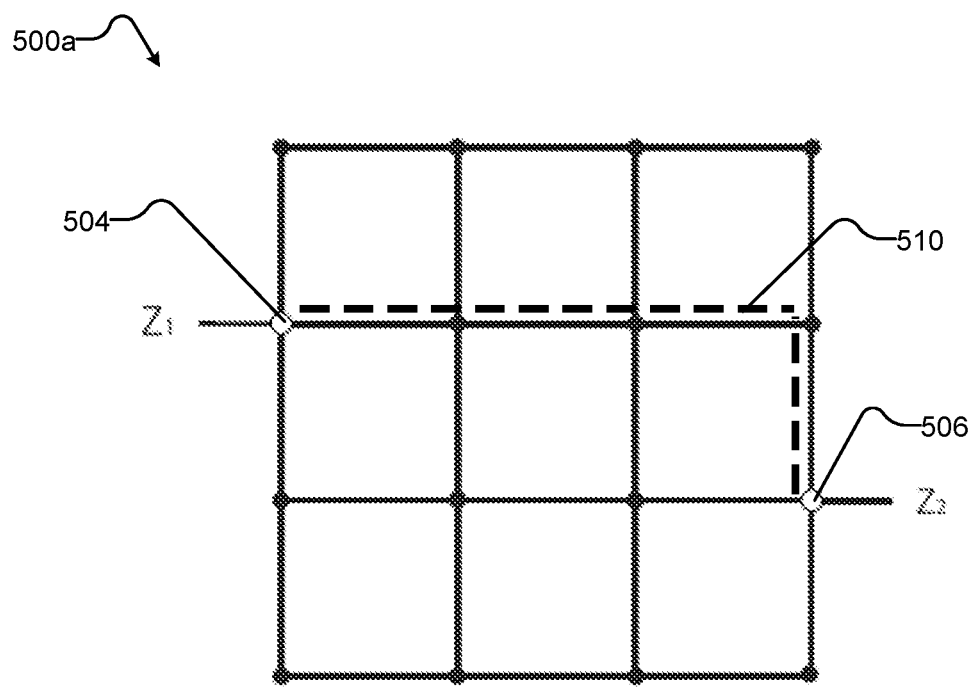
FIG. 5A is a schematic diagram of a logical qubit with a three-by-three square lattice and tunable couplers on first and second exterior sides.
Figure 5B:
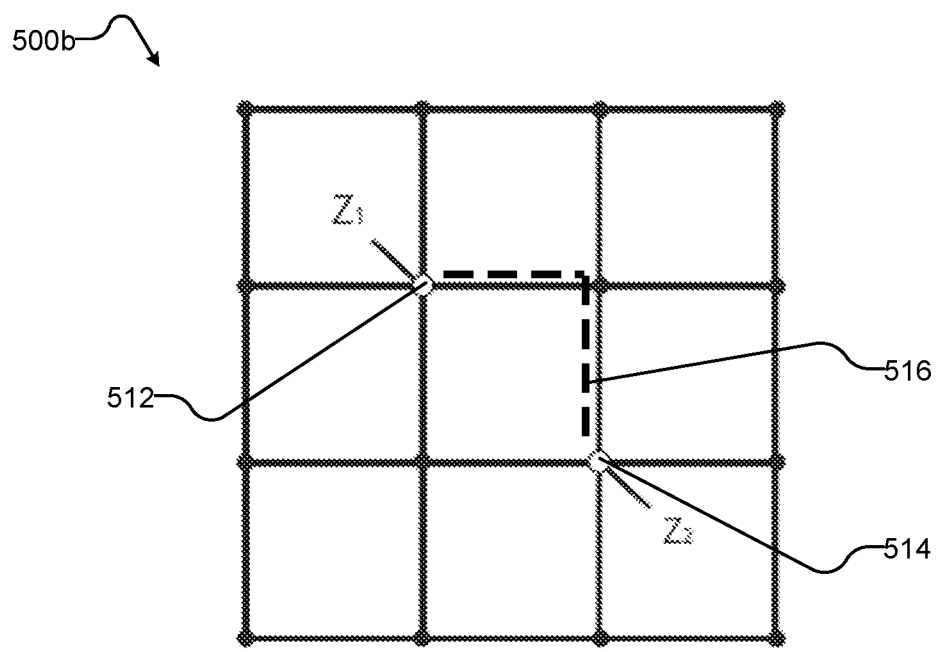
FIG. 5B is a schematic diagram a logical qubit with a three-by-three square lattice and tunable couplers on an interior.

In the example implementation of FIG. 4, first and second tunable couplers 402, 404 are positioned on diagonally opposite corners of the three-by-three square lattice. Referring to FIG. 5A, first and second tunable couplers 504, 506 may also be positioned on first and second exterior sides of the three-by-three square lattice. Referring to FIG. 5B, first and second tunable couplers 512, 514 may be positioned on an interior of the three-by-three lattice. As discussed in further detail below, the example implementation of FIG. 5B may beneficially be more robust against dephasing relative to the implementations of FIG. 4 and FIG. 5A, but may also be less robust against relaxation of the system. A microwave control line 510 may be provided between tunable couplers 504 and 506 as shown in FIG. 5A, and similarly, a microwave control line 516 may be provided between first and second tunable couplers 512 and 514 of FIG. 5B. It will be understood that the positioning of microwave control lines 510 and 516 are example implementations, and microwave control lines 510 or 516 may be positioned on any path between tunable couplers. Relative to the example implementation of FIG. 4, it may be easier to transition the qubits along the path in FIG. 5A as fewer qubits must be transitioned, and may be easier again to transition the qubits along the path in FIG. 5B as even fewer qubits must be transitioned, due to the effects of noise increasing the difficulty of consistently transitioning larger numbers of qubits. It will also be understood that other control signal sources may be connected instead of a microwave control line. For example, a control signal source may include a digital to analog converter (DAC) that applies a signal to all qubits along a path between the tunable couplers to cause all the qubits along that path to flip. In some implementations, the control signal source may be positioned to flip all of the qubits along a shortest path between the tunable couplers. It may be beneficial to control the qubits along a shortest path as this reduces the number of qubits that need to be flipped, and may make transitioning all of the qubits easier to achieve.

FIGS. 3A through 5B are example diagrams implementations of a topologically protected logical qubit. Referring to FIG. 4, each edge is a physical qubit 408 and each node 402, 404, 406 is a coupler, such as, for example, a coupling device 812 described below with respect to FIG. 8. The black-filled circles represent fixed couplers 406 and the hollow circles represent tunable couplers 402, 404 that can be turned off, generating defects in the lattice. Tuning or turning off tunable couplers 402, 404 may be performed by on- or off-chip control structures such as control lines or control structures including DACs. As used herein, "tunable coupler" refers to a coupler having an adjustable coupling strength that may, for example, be controlled by a control line coupled to the coupler. A tunable coupler must be capable of at least being able to be turned on and off, and in some implementations, the magnitude of the coupling may also be tunable. The control line may apply a signal to the coupler to change the coupling strength as required. The tunable coupler will be turned off unless or until it is desired to use one of the external qubits (e.g., 412, 414) for gate operations or readout. The magnitude of the coupling to the external qubit in combination with the bias applied to the external qubit and the gate duration may all be tuned to control the gate. As such, while in some implementations, the coupling strength may be varied using a control line, gate operations may be performed with a tunable coupler having only on or off states. In contrast, a "fixed coupler" as discussed herein refers to a coupler having a fixed coupling strength that is determined by the physical properties of the coupler and is not varied during operations on the quantum processor. The structure of the fixed couplers and the tunable couplers may be similar to the structure discussed below with respect to FIG. 8, with the tunable coupler having one or more communicatively coupled control lines to allow the coupling strength to be varied and the tunable coupler to be switched on and off. Other fixed and tunable couplers as are known in the art may also be used.

Each coupler enforces even parity in all the qubits that are connected to it:

$$H_{coupler} = -K\sigma_1^z\sigma_1^z \ldots \sigma_k^z = -K_z \prod_{i=1}^{k} \sigma_i^z$$

where k is the number of qubits connected to the coupler; k=2, 3, or 4, depending on the position of the coupler, and $K_z$ is the energy penalty for odd-parity combinations. A four qubit parity stabilizer, such as the one described below with respect to FIG. 8, may be used to provide two, three, and four qubit parity stabilization. It will be understood that other four qubit parity stabilizers may be used, such as the implementation disclosed in Chancellor et al., and discussed above. A three qubit parity stabilizer can be obtained from a four qubit coupler by setting $\sigma_i^z=+1$ for one of the inputs. A two qubit parity stabilizer can also be obtained from a four qubit coupler by setting two inputs to +1, or simply by ferromagnetically coupling the two qubits with coupling strength $K_z$. In FIG. 4, there are two nodes that are represented by hollow circles with external legs, labeled by $Z_1$ and $Z_2$, representing the classical states of two external qubits 412 and 414. Considering these as usual three qubit couplers and assuming $Z_1=Z_2=+1$, there is no difference between these couplers and the other two qubit couplers on the remaining two corners.

The Hamiltonian of the system is written as $$H = -\Delta \sum_i \sigma_i^x - K_z \sum_s \prod_{j \in s} \sigma_j^z$$

which is the Hamiltonian of the toric code. Using perturbation expansion, this gives $K_x \sim \Delta^4/K_z^3$.

Logical qubit 400 in FIG. 4 is made of a 3×3 square lattice including 24 physical qubits. The lattice has 9 plaquettes (X-constraints) defined by four physical qubits and four couplers arranged in a square and 16 stars (Z-constraints) defined by couplers that act as nodes where qubits meet, for a total of 25 constraints. However, one of the Z-constraints is redundant, as that constraint can be obtained by multiplying all the other 15 Z-constraints. As such, there are 24 constraints and 24 physical qubits, with no remaining degree of freedom. In order to encode a logical qubit, at least two Z-constraints must be removed, as one constraint is already redundant. The two hollow circles in FIG. 4 represent constraints that are removed, i.e., defects. This can be done by turning off tunable couplers 402, 404 or simply by releasing the condition $Z_1=Z_2=+1$. Multiplying all the 16 Z-constraints leads to a new constraint: $Z_1Z_2=+1$, i.e., $Z_1=Z_2=\pm 1$. This freedom can be used to encode the logical |0⟩ and |1⟩ states. Notice that $Z_1$ and $Z_2$ always have the same values, otherwise an error has occurred, i.e., a leakage from the protected subspace. It may be beneficial to uncouple $Z_1$ and $Z_2$ qubits from the rest of the qubits and only use the $Z_1$ and $Z_2$ qubits during initialization, gate operations, or readout. The lattice in FIG. 4 can have other sizes (e.g., instead of N×N as in FIG. 4, a lattice having unequal dimensions N×M may also be used) with all the above arguments still valid.

To transition between |0z,46 and |1⟩ states, physical qubits along a path connecting the two defects should flip (assuming $Z_1$ and $Z_2$ are uncoupled). The shortest path includes N+M qubits, therefore, the tunneling amplitude between |0⟩ and |1⟩ is on the order of $\sim(\Delta/K_z)^{N+M}K_z$. As the energy gap generated by plaquette tunneling is fourth order in perturbation, N+M is beneficially >4 to increase stability and ensure tunneling between logical states is well defined.

Logical qubit 400 can be used to perform a logical X-operation. A microwave signal is applied simultaneously to all N+M qubits along a path connecting the two defects, e.g., the path going through the top and rightmost qubits in FIG. 4. The dashed line in FIG. 4 represents microwave line 410 that carries the microwave signal. If the frequency of the microwave is in resonance with the energy gap between the ground state and an excited state that has overlap with both logical states, a transition between the two logical state can be induced, i.e., an X-operation.

External qubits, 412 and 414, also referred to as $Z_1$ and $Z_2$, can be used for initialization, readout, and coupling the logical qubits to each other, as discussed in further detail below. To initialize the logical qubit, one or both of $Z_1$ and $Z_2$ qubits are hard biased to +1 or −1 before turning on the Hamiltonian. The hard bias may, for example, be applied by a bias line communicatively coupled to each external qubit. Other bias structures may also be used to control bias applied to the external qubits, as will be understood by those of skill in the art. At the end of calculation, the logical state of the logical qubit can be read out by measuring the state of one of these external physical qubits.

Figure 6A:
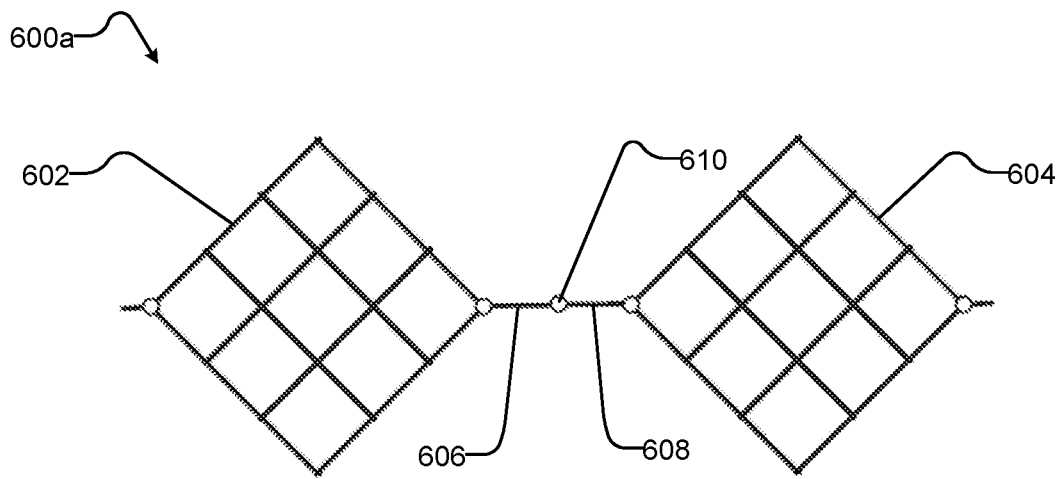
FIG. 6A is a schematic diagram of two coupled logical qubits coupled by external qubits and a tunable coupler.
Figure 6B:
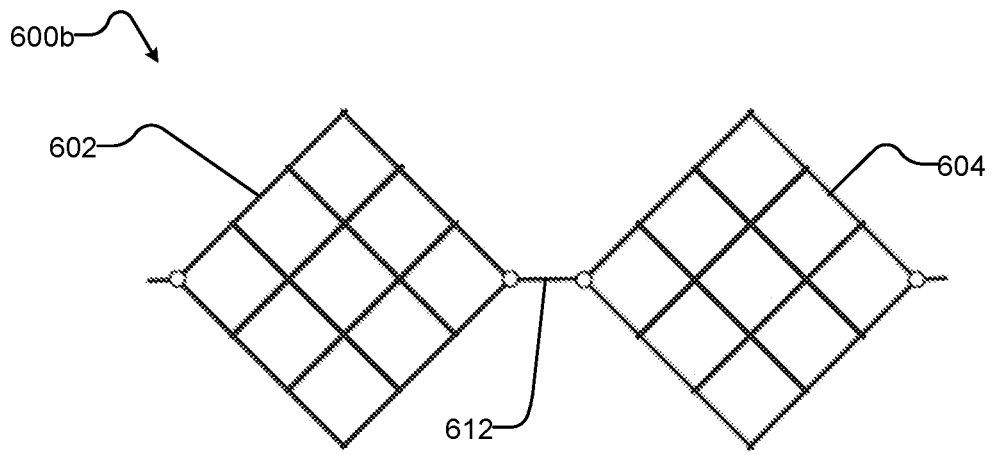
FIG. 6B is a schematic diagram of two coupled logical qubits coupled by one shared qubit.
Figure 6C:
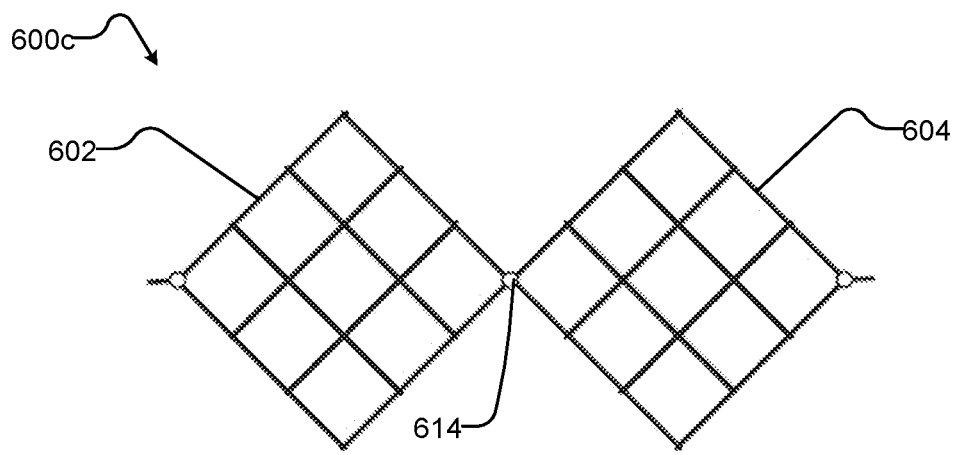
FIG. 6C is a schematic diagram of two coupled logical qubits coupled by a tunable four qubit coupler.
Figure 7A:
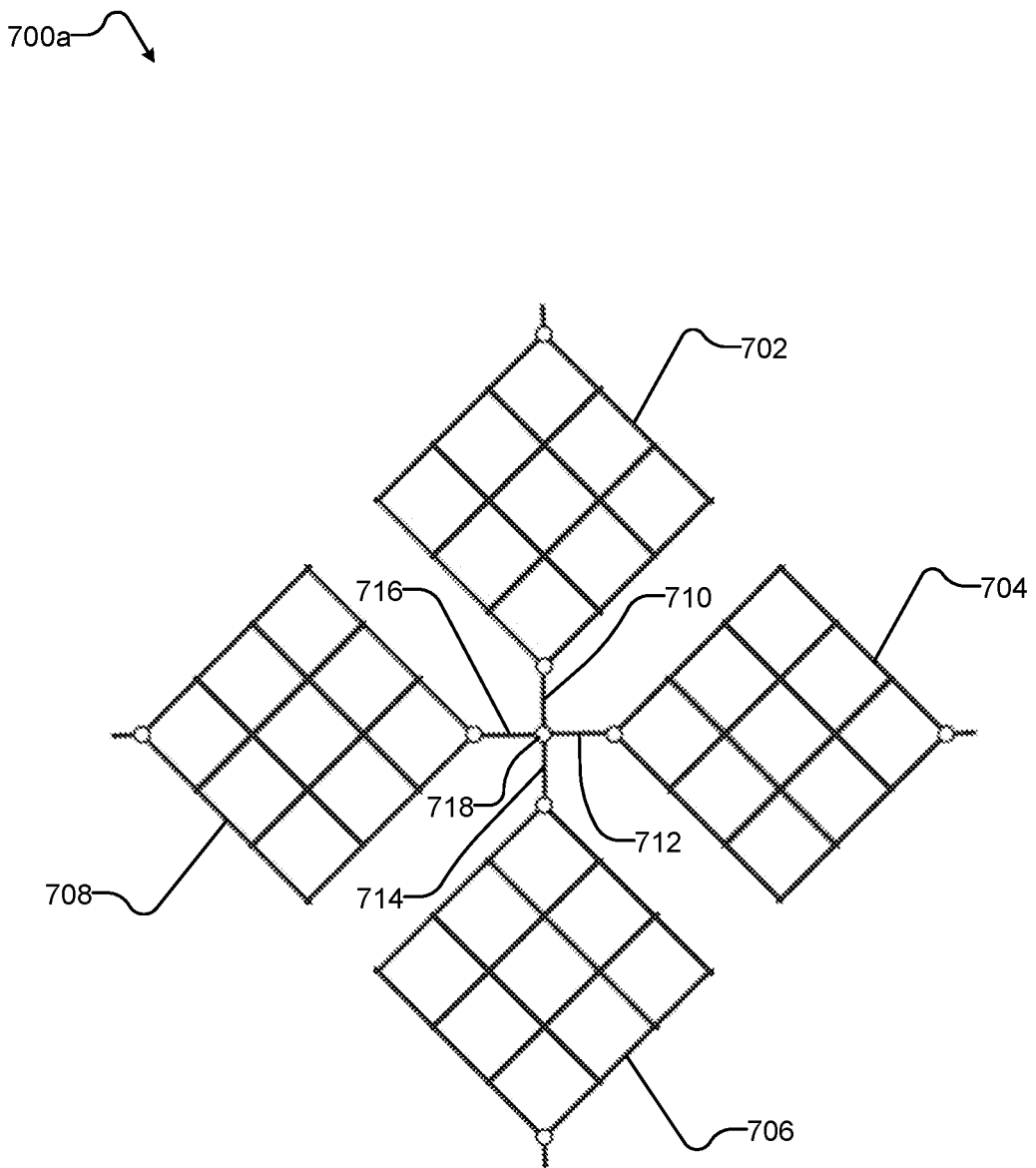
FIG. 7A is a schematic diagram of multiple logical qubits coupled by physical qubits connected to an intermediate coupler.
Figure 7B:
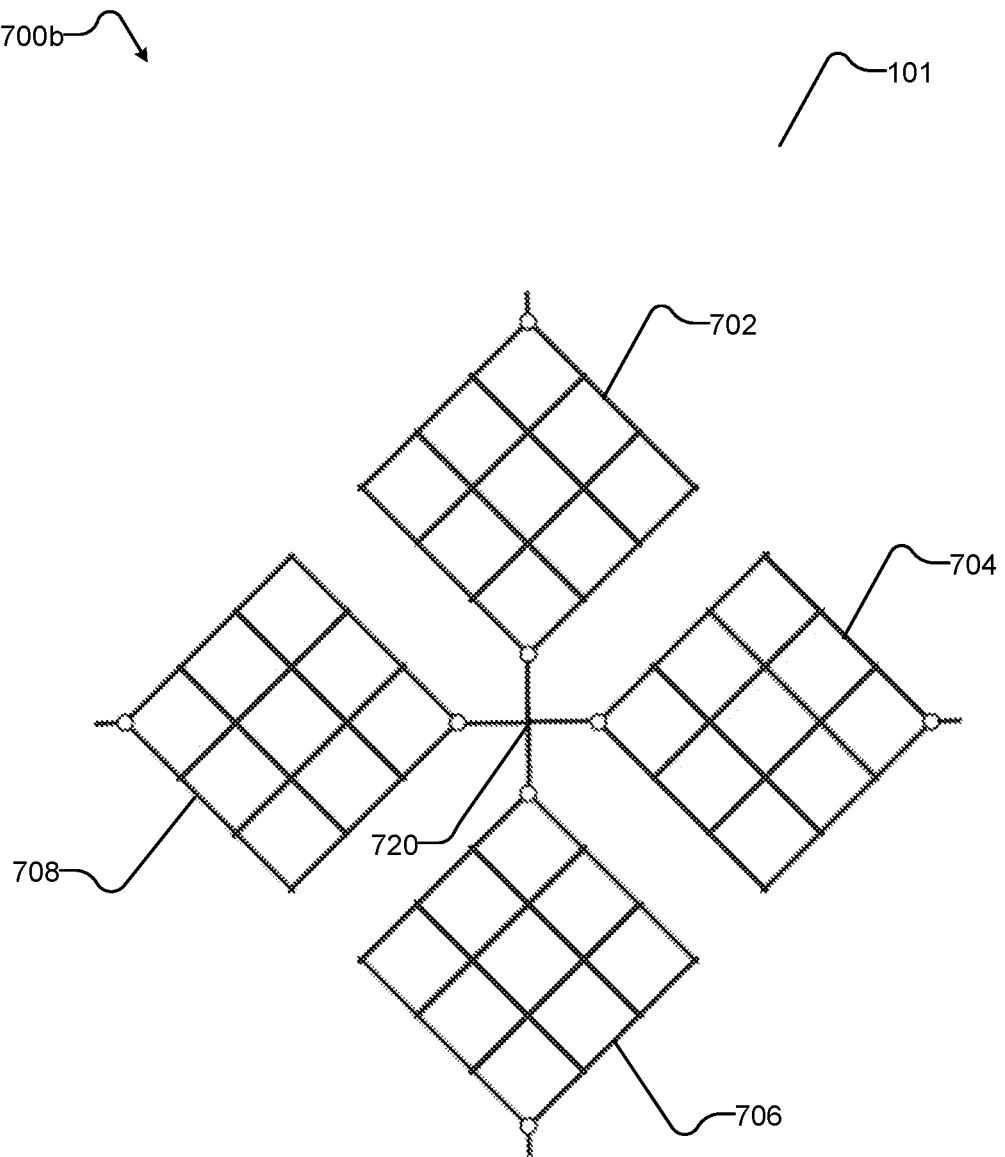
FIG. 7B is a schematic diagram of multiple logical qubits coupled by a single shared qubit.

To couple two logical qubits, the external legs may be coupled, as displayed in FIG. 6A. This provides a ZZ coupling with a strength that may be controlled by an intermediate coupler 610. Two logical qubits may also be coupled with one shared qubit 612 as shown in FIG. 6B or by direct coupling with a tunable four qubit coupler as shown in FIG. 6C. The latter may beneficially reduce dephasing due to external qubits. A logical qubit may also be coupled to more than one other logical qubit, as shown in FIG. 7A. In FIG. 7A, four external qubits 710, 712, 714, 716 of logical qubits 702, 704, 706, 708 are coupled via a tunable four qubit coupler 718. When coupling any pairs of logical qubits, it may be beneficial to turn on the corresponding coupler while the other couplers are turned off. Turning on all four couplers and the intermediate coupler will create a four qubit interaction at the logical level. One shared qubit 702 may also be used instead of four as shown in FIG. 7B. In this figure the cross between the qubits is considered as a single qubit.

A quantum processor may contain a plurality of logical qubits, such as logical qubits 300a, 300b, 400, 500a, and 500b discussed herein. Each logical qubit of the plurality of logical qubits may be communicatively coupled to at least one other logical qubit of the plurality of logical qubits. Referring to a portion of a quantum processor 600a of FIG. 6A, coupled logical qubits 602 and 604 are connected by two physical qubits 606 and 608 and an intermediate coupler 610. Referring to a portion of a quantum processor 600b of FIG. 6B, coupled logical qubits 602 and 604 are connected by one shared physical qubit 612. Referring to a portion of a quantum processor 600c of FIG. 6C, coupled logical qubits 602 and 604 are directly coupled with a tunable four qubit coupler by sharing a tunable coupler 614.

Referring to a portion of a quantum processor 700a in FIG. 7A, multiple logical qubits 702, 704, 706, 708 may be coupled by physical qubits 710, 712, 714, 716 connected to an intermediate coupler 718. It will be understood that the four logical qubits shown in FIG. 7A are an example only, and any number of logical qubits may be coupled by physical qubits and an intermediate coupler in a similar manner. Intermediate coupler 718 may be an intermediate tunable four qubit coupler. Referring to FIG. 7B, a portion of a quantum processor 700b similarly has multiple logical qubits 702, 704, 706, 708, which are, in this example implementation, coupled by a single shared qubit 720.

One approach to implementing a four qubit even-parity stabilizer is to use one or more auxiliary qubits. A search over a space of discretized two local couplings and 1-local biases can reveal configurations that result in eight possible even-parity logical qubit states being degenerate ground states. See International Patent Application No. PCT/US2021/024134, now published as WO 2021/195368 for a discussion of even-parity stabilizers. As discussed above, odd parity stabilizers may also be used in some implementations, with the enforcement of parity in order to form degenerate states being preserved and the parameters varied such that the odd parity stabilizer effectively behaves as an even parity stabilizer. That is, the lowest energy state will be one in which an even number of qubits are in each state.

FIG. 8 is a schematic diagram of an example implementation of a circuit 800 including a four qubit stabilizer as discussed in International Patent Application No. PCT/US2021/024134, now published as WO 2021/195368, and which may be used to provide coupling as described herein. In circuit 800, four physical qubits 802, 804, 806, and 808, and an auxiliary qubit 810 are communicatively coupled by coupling device 812, which is a single linear coupling device. Each of physical qubits 802, 804, 806, and 808 includes a superconducting loop 814, 816, 818, and 820, respectively, as discussed above with respect to FIG. 2. Each of superconducting loops 814, 816, 818, and 820 includes a material that is superconducting at and below a critical temperature, which is an inherent characteristic of the material. In the example implementation of FIG. 8, superconducting loops 814, 816, 818, and 820 include crossovers 822, 824, 826, and 828, respectively. In the cross-shaped arrangement of circuit 800, crossovers 822, 824, 826, and 828 may change the sign of interactions with qubit 802 relative to those between qubits 804, 806, and 808, and auxiliary qubit 810.

A superconducting loop topologically formed by a 180° out of plane rotation of a portion of the superconducting loop is referred to in the present application as a superconducting loop with a crossover. Current through the superconducting loop on one side of the crossover flows in a clockwise direction around the loop, and current through the superconducting loop on the other side of the crossover flows in an anti-clockwise direction around the loop. The two segments of the superconducting loop that cross over each other are galvanically isolated from each other at the crossover.

An interaction Hamiltonian for the system can be expressed as follows:

$$\hat{H}_{int} = \frac{1}{2}\left[\sum_{i=1}^{4} M_{ci}\hat{I}_i^p + M_{cp}\hat{I}_p^p\right]\hat{I}_c^p$$

Provided the coupling device is linear with susceptibility $\chi_1^c$, then the persistent current operator for the coupling device can be expressed as follows:

$$\hat{I}_c^p = \chi_1^c\left[\sum_{i=1}^{4} M_{ci}\hat{I}_i^p + M_{cp}\hat{I}_p^p\right]$$

where $\hat{I}_i^p$ is the persistent current operator for the $i^{th}$ qubit. By combining equations, the interaction Hamilton $\hat{H}_{int}$ can be expressed as follows:

$$\hat{H}_{int} = \sum_{i=1}^{4}\left[M_{ci}M_{cp}\chi_1^c|I_q^p||I_q^p|\hat{\sigma}_i^z\hat{\sigma}_p^z + \sum_{j>i}^{N} M_{ci}M_{cj}\chi_1^c|I_q^p|^2\hat{\sigma}_i^z\hat{\sigma}_j^z\right]$$

Choosing the following values can achieve a desired result:

$$-M_{c1}=M_{c2}=M_{c3}=M_{c4}\equiv M_{cq}>0$$

and $$M_{cp}|I_p^p|=2M_{cq}|I_q^p|$$

Referring again to FIG. 8, each of superconducting loops 814, 816, 818, and 820 is interrupted by a compound-compound Josephson junction (CCJJ) 830, 832, 834, and 836, respectively. As used herein, compound-compound Josephson junction refers to a Josephson Junction where one or more of the junctions within a compound Josephson junction is itself a compound Josephson junction.

In the example implementation of FIG. 8, auxiliary qubit 810 (also referred to in the present application as a parity-enforcing qubit) is communicatively coupled to coupling device 812 by a fully galvanic CJJ coupling device. In other implementations, auxiliary qubit 810 may be a different kind of qubit, such as the probe qubit described in U.S. Pat. No. 10,068,180. In other implementations, auxiliary qubit 810 has a different form of communicative coupling to coupling device 812, such as the galvanic CJJ coupling device of International PCT Publication No. WO2019126396. In some implementations, coupling device 812 of FIG. 8 can provide one example of a tunable coupler, where the tunable coupler can be tuned by applying a control signal or bias to auxiliary qubit 810. In another implementation, coupling device 812 of FIG. 8 may also be used as a fixed coupler, with coupling device 812 providing a constant magnetic coupling between the qubits 802, 804, 806, and 808.

Figure 9:
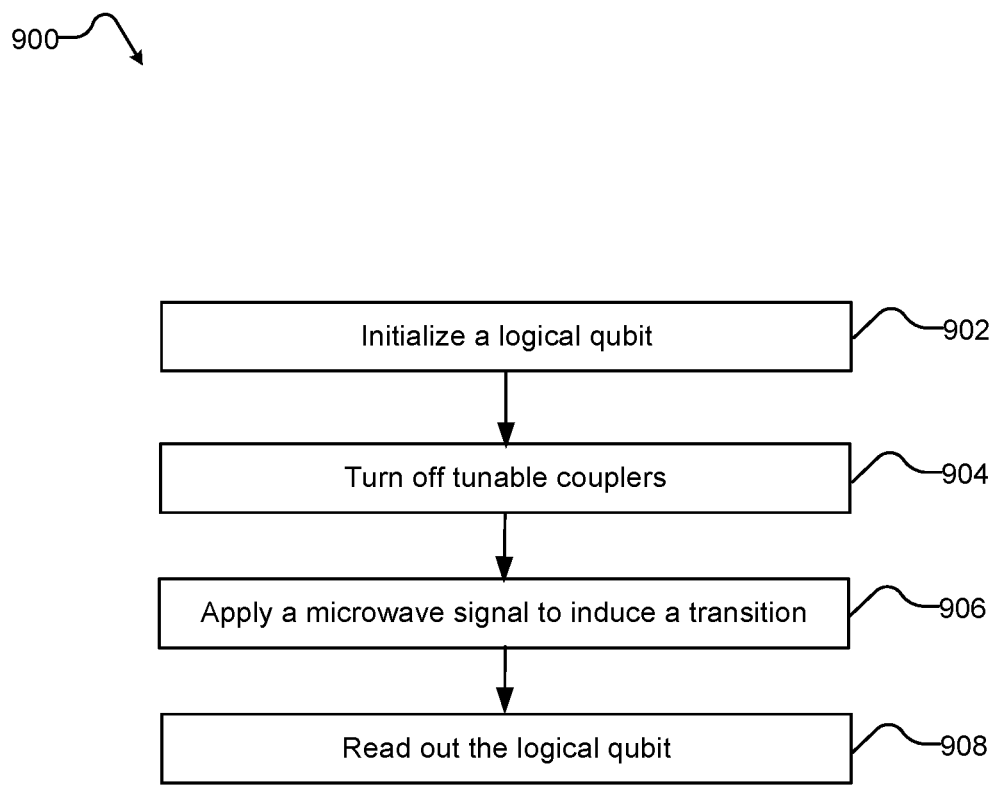
FIG. 9 is a flow diagram of an example method of performing a logical X operation on a logical qubit.

FIG. 9 is a flow diagram of an example method 900 of performing a logical X operation on a logical qubit, such as logical qubits 300a, 300b, 400, 500a, and 500b discussed herein. A logical X operation may also be referred to as a bit flip operation. Method 900 may be executed on a hybrid computing system comprising at least one digital or classical processor and a quantum processor, for example hybrid computing system 100 of FIG. 1, or may be executed on a quantum computing system comprising at least one quantum processor. Method 900 can be employed to advantageously improve a computational performance of a quantum process.

Method 900 comprises acts 902 to 908, however, a person skilled in the art will understand that the number of acts illustrate is an example, and, in some implementations, certain acts may be omitted, further acts may be added, and/or the order of the acts may be changed.

Method 900 starts, for example, in response to a call or invocation from another routine.

At 902, the processor, which may be a classical or digital processor of a hybrid computing system or a quantum processor that is stand alone, or part of a hybrid computing system as discussed above causes the logical qubit to be initialized, for example by hard biasing one or both external qubits, such as with bias lines in communication with the external qubits. As used herein, hard biasing refers to applying a bias directly to the qubit that is sufficiently large that the qubit state is fixed in a selected one of the two possible states regardless of the states of other qubits. In some implementations a plurality of logical qubits may be initialized.

At 904, the processor causes one or more of the tunable couplers to be turned off, such as by sending a control signal through a bias line in communication with the tunable coupler, or by activating a DAC in communication with the tunable coupler.

At 906, the processor causes a microwave signal to be applied through a microwave line communicatively coupled to all physical qubits along a path connecting the two tunable couplers, the microwave signal comprising a frequency that is in resonance with the energy gap between the ground state and an excited state that has overlap with two logical states to induce a transition between the two logical states. This frequency may, for example, be determined using microwave spectroscopy of the processor, or through other techniques as are known in the art. As discussed above, this may include flipping all of the qubits on the path connecting the two tunable couplers by causing a microwave signal to be applied simultaneously or concurrently to all qubits along the path connecting the two tunable couplers. In some implementations, a plurality of microwave signals may be applied through a plurality of microwave lines, with each of the plurality of logical qubits having a respective microwave line.

At 908, the processor causes a read out of the logical qubit by measuring the state of one of the external qubits. In some implementations the processor may cause a read out of a plurality of logical qubits.

Method 900 may then terminate until it is, for example, invoked again, or method 900 may repeat. The readout value of the logical qubit at 908 may be passed to another algorithm for further processing or may be returned as a solution to the problem.

The method may optionally include coupling the logical qubit to one or more other logical qubits by turning on a corresponding coupler prior to applying the microwave signal in order to implement a two or more qubit logical gate.

It may be beneficial to tune the energies of the logical zero state and the logical one state of the logical qubit. This will be described with respect to logical qubit 400 of FIG. 4, however, it will be understood that similar tuning may be applied to the logical qubits of FIGS. 5A through 7B.

As discussed in further detail herein, turning off first and second tunable couplers 402 and 404 of logical qubit 400 allows for the creation of degenerate states. However, connecting first and second tunable couplers 402 and 404 allows for a phase shift to tune the energies of the logical zero and logical one states of logical qubit 400 by applying bias to one or both of external qubits 412 and 414.

Figure 10:
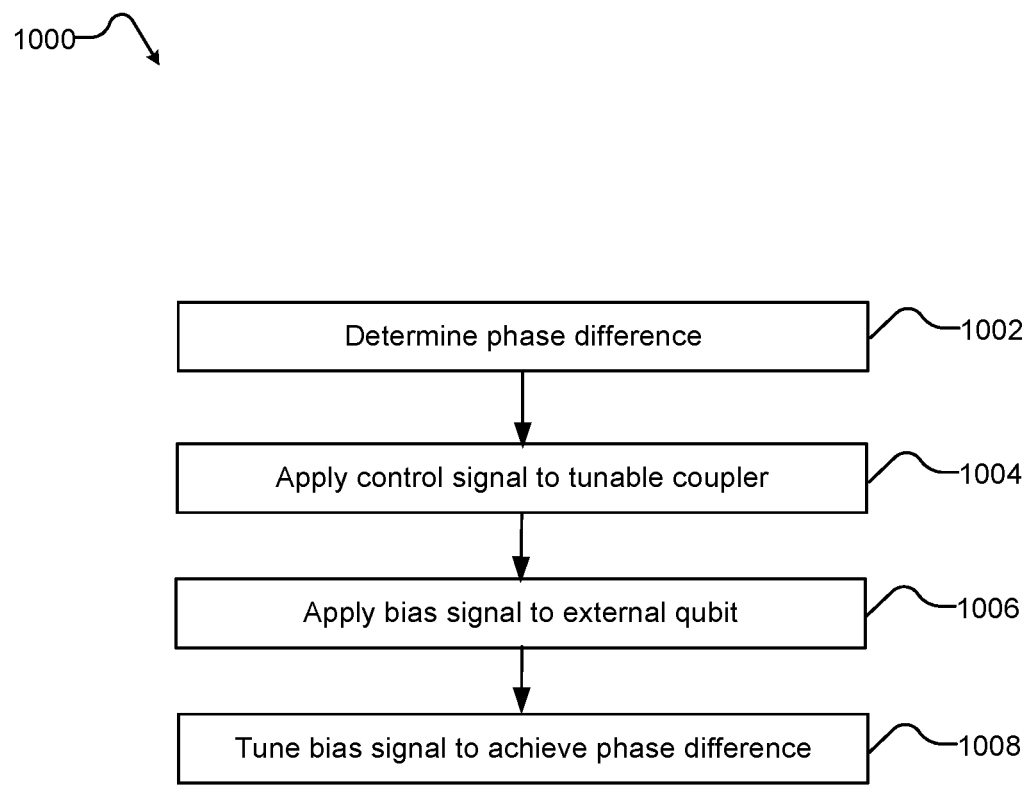
FIG. 10 is a flow diagram of an example method of performing a logical Z operation on a logical qubit.

FIG. 10 is a flow diagram of an example method 1000 for performing a logical Z operation on a logical qubit, such as logical qubits 300a, 300b, 400, 500a, and 500b discussed herein. A logical Z operation may also be referred to as a phase flip operation. Method 1000 may be executed on a hybrid computing system comprising at least one digital or classical processor and a quantum processor, for example hybrid computing system 100 of FIG. 1, or may be executed on a quantum computing system comprising at least one quantum processor. Method 1000 can be employed to advantageously improve a computational performance of a quantum process.

Method 1000 comprises acts 1002 to 1008, however, a person skilled in the art will understand that the number of acts illustrate is an example, and, in some implementations, certain acts may be omitted, further acts may be added, and/or the order of the acts may be changed.

Method 1000 starts, for example, in response to a call or invocation from another routine.

At 1002, the processor determines a phase difference to be applied to the logical qubit. This may be determined in advance by another routine, provided by a user, or generated based on a measurement of the system.

At 1004, the processor causes a control signal to be applied to activate the first tunable coupler. Control signals may be applied by an external processor through lines that communicate with the quantum processor, or through control devices on the quantum processor, as discussed in further detail herein. In some implementations, the processor may activate both the first tunable coupler and the second tunable coupler. For example, referring to FIG. 4, first tunable coupler 402 may be activated. Coupling by first tunable coupler 402 reduces the degeneracy of the system the system.

At 1006, the processor causes a bias signal to be applied to the external qubit in communication with the first tunable coupler. As above, this may be achieved by an external processor through lines that communicate with the quantum processor, or by on chip control devices. In some implementations, a bias signal may be applied to each of the external qubit in communication with the first tunable coupler and the external qubit in communication with the second tunable coupler. Referring to FIG. 4, a bias may be applied to external qubit 412. In other implementations, second tunable coupler 404 and external qubit 414 may be used for tuning one or both of first and second tunable couplers 402 and 404, and external qubits 412 and 414 may be used for tuning.

At 1008, the processor tunes the duration and magnitude of the bias signal to achieve the determined phase difference in the logical qubit. The magnitude and duration of the bias allows for the phase difference added to be tuned.

Method 1000 may then terminate until it is, for example, invoked again, or method 1000 may repeat on the same logical qubit or a different logical qubit. Method 1000 may be performed in parallel on multiple qubits.

It will be understood that coupling external qubits 412 and 414 to the rest of logical qubit 400 increases the susceptibility of the system to noise. As described above, a bias on external qubits 412 or 414 can be used to change the phase of logical qubit 400. As such, if noise from the external environment were to bias external qubits 412 or 414 while coupled in logical qubit 400, this may result in dephasing of logical qubit 400. As described herein, it may be beneficial to selectively couple external qubits 412 and 414 only for measurement, programming, and logical Z operations.

Relaxation and Dephasing

To the lowest order perturbation, the relaxation rate is proportional to $$T_1^{-1} \propto |\langle 0|\hat{O}|1\rangle|^2$$

where $\hat{O}$ is an operator that describes coupling to the environment. Typically, noise is local with a form like $$\hat{O} = \sum_i \sigma_i^a Q_i$$

where a=z for flux noise and a=y for charge noise, and $Q_i$ is an operator acting on the environment. Details of the noise spectral density does not affect the following arguments. The lowest order contribution to noise is zero for local noise operators.

Since transition between the two logical state include M+N qubit flips (excluding the external qubits assuming the hollow couplers are off), local noise has zero matrix element in the relaxation rate. One needs to go to (M+N)-th order of perturbation to get a nonzero result:

$$T_1^{-1} \propto \sum_P \prod_{\{n_i\} \in P} \frac{\langle 0|\hat{O}|n_1\rangle \langle n_1|\hat{O}|n_2\rangle \ldots \langle n_{M+N}|\hat{O}|1\rangle}{(E_0 - E_{n_1})(E_0 - E_{n_2}) \ldots (E_0 - E_{n_{M+N}})}$$

where $|n\rangle$ is an excited state above $|0\rangle$ and $\equiv 1\rangle$ and P is a path of M+N qubits connecting the two defects. This an (M+N)-photon process. Relaxation rate is therefore suppressed up to N+M order of perturbation and can become extremely small for large N+M. Including the external qubits, $Z_1$ and $Z_2$, will increase this number by two, hence increasing the relaxation time, but has a detrimental effect on the dephasing time, as discussed below. To increase the relaxation time, N+M can be increased at the cost of adding more physical qubits. The relaxation rate is also suppressed by the gap between $E_0$ and the excited states above the logical state. Therefore, by increasing the gap the relaxation rate may be suppressed, and the relaxation time may therefore be enhanced. However, this gap is produced via four qubit cotunneling of the plaquettes (ignoring possible ancillas inside the couplers) and therefore there is a limit on how much this gap can be increased.

Pure dephasing happens when $E_0 - E_1$, i.e., the energy difference between $|0\rangle$ and $|1\rangle$ states, fluctuate due to low frequency noise. The dephasing rate, to the first order of perturbation, is therefore proportional to $$T_\varphi^{-1} \propto \delta E_0 - \delta E_1 \propto \langle 0|\hat{O}|0\rangle - \langle 1|\hat{O}|1\rangle$$

where $\hat{O}$ is an operator that couples the qubits to the environment. In the absence of $Z_1$ and $Z_2$ qubits (hollow couplers off), all the internal qubits have zero expectation values of $\sigma_i^a$, a=x, y, z, in both $|0\rangle$ and $|1\rangle$ states. Therefore, slow fluctuation of the applied (flux or charge) biases to these qubits do not shift the energies of the logical states to the first order perturbation, and therefore do not cause dephasing. As such the logical qubits can have a large dephasing time, in principle. Coupling $Z_1$ and $Z_2$ qubits to the system may impact the dephasing time. The states of these additional qubits are aligned with the logical states, making single qubit operator $\sigma_i^z$, i being one of the qubits $Z_1$ or $Z_2$, to have different expectation values in $|0\rangle$ and $|1\rangle$ states. Any parasitic bias applied to these qubits will lead to dephasing of the logical qubit. It may therefore be beneficial to switch off the coupling to these external qubits and only couple them for initialization, readout, or gate operations.

In the absence of $Z_1$, $Z_2$ qubits, i.e., when the hollow couplers are turned off, the qubits that maximally contribute to dephasing are the remaining four (internal) qubits coupled to the hollow couplers. For a pair of these qubits, e.g., the two qubits corresponding to the $Z_1$ defect, it can be expressed that:

$$|0\rangle = |\uparrow\uparrow\rangle \otimes |\text{rest}\rangle_{\uparrow\uparrow} + |\downarrow\uparrow\rangle \otimes |\text{rest}\rangle_{\downarrow\downarrow}$$

$$|1\rangle = |\uparrow\downarrow\rangle \otimes |\text{rest}\rangle_{\uparrow\downarrow} + |\downarrow\rangle \otimes |\text{rest}\rangle_{\downarrow\uparrow}$$

where $|\text{rest}\uparrow\downarrow\rangle_{aa}$ denotes the state of the rest of the qubits. It is clear that different combinations of two-qubit states appear in $|0\rangle$ and $|1\rangle$. This means a bias applied to these qubits via noise can in principle affect $|0\rangle$ and $|1\rangle$ differently, hence fluctuating their energy difference $E_0 - E_1$ and resulting in dephasing. However, a local noise such as $\hat{O}$ has zero average in both $|0\rangle$ and $|1\rangle$ states, i.e., no dephasing to the first order perturbation. This is analogous to the "sweet spots", or optimal tuning found in the energy anti-crossings of superconducting qubits, as will be understood by those of skill in the art. The higher order correction to $E_0 - E_1$ is therefore considered as:

$$T_\varphi^{-1} \propto \sum_D \prod_{\{n_i\} \in D} \frac{\langle 0|\hat{O}|n_1\rangle \langle n_1|\hat{O}|n_2\rangle \ldots \langle n_D|\hat{O}|0\rangle}{(E_0 - E_{n_1})(E_0 - E_{n_2}) \ldots (E_0 - E_{n_D})} -$$

$$\sum_D \prod_{\{n_i\} \in D} \frac{\langle 1|\hat{O}|n_1\rangle \langle n_1|\hat{O}|n_2\rangle \ldots \langle n_D|\hat{O}|1\rangle}{(E_0 - E_{n_1})(E_0 - E_{n_2}) \ldots (E_0 - E_{n_D})}$$

where D is a is a set of qubits around a defect. Once again, the role of the energy gap in the protection becomes clear.

When the energy gap between these $|0\rangle$ and $|1\rangle$ states and the excited states above them is large this correction is suppressed. This energy gap is a result of plaquette tunneling and therefore is $4^{th}$ order in $\Delta$ (i.e., $K_x \sim \Delta^4/K_z^3$). The gap can become small, leading to a large dephasing. Making the lattice larger does not reduce dephasing, although it reduces relaxation.

To reduce dephasing, either the energy gap may be increased or the number of qubits participating in the perturbation correction to $E_0-E_1$ may be increased, i.e., the number of qubits needed to distinguish $|0\rangle$ and $|1\rangle$. By moving the defects (tunable couplers 504 and 506 of logical qubit 500a) from the corners to the sides, as shown in FIG. 5A, the number of qubits around the defect increases from 2 to 3. Therefore, three qubit combinations are needed to distinguish $|0\rangle$ and $|1\rangle$ leading to a decreased dephasing. This comes with the price of increased relaxation because the defects are now closer to each other (4 qubits between them, instead of 6). Dephasing may be reduced even further by moving the defects (first and second tunable couplers 512 and 514 of logical qubit 500b) to the middle, as shown in FIG. 5B, at the price of increasing relaxation even more (two qubit distance between the defects). Relaxation time can be increased by increasing the size of the lattice, which requires a larger number of physical qubits. The hollow couplers in FIG. 5B are now 5-qubit parity enforcers. Dephasing can be decreased as much as desired by making bigger holes for defects, e.g., removing two adjacent constraints with more unconstrained qubits around the defect. To implement such a parity stabilizer with many inputs for initialization, readout, and qubit-qubit coupling is included. Such parity stabilizers are described in Chancellor et al., discussed above, but the presence of the many ancilla qubits can slow down the dynamics and decrease the gap size.

The principles discussed herein can be generalized to other architectures and qubit arrangements. For example, FIG. 3A shows a 1-dimensional architecture, with three plaquettes. Each plaquette is a loop made of two qubits (upper and lower arches) and two couplers. As before, the middle couplers are four qubit parity enforcers, but the two end couplers are switchable three qubit parity enforcers. The plaquette tunneling is therefore via two-qubit tunneling, leading to a larger gap than in the implementations of FIGS. 4, 5A, and 5B. The logical states are defined as before. Tunneling between the logical states is via cotunneling of all qubits in any path connecting the end couplers. Therefore, the tunneling amplitude in FIG. 3A is obtained via $3^{rd}$ order perturbation. By increasing the length of the structure, as depicted in FIG. 3B, the tunneling amplitude can be decreased. Likewise, logical X operations can also be performed by applying a microwave signal to all qubits in the top row, or any other paths connecting the two defects. Relaxation rate also comes in third order perturbation in FIG. 3B, and can be reduced by increasing the number of plaquettes. It does not appear to be possible to increase dephasing time in a similar manner to that described above, because the end defects only involve two qubits, regardless of the size. It is also possible to define lattices with triangular plaquettes or other types of plaquettes following the same principles.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned U.S. patent application publications, U.S. patent applications, foreign patents, and foreign patent applications referred to in this specification and/or listed in the Application Data Sheet are incorporated herein by reference, in their entirety, including but not limited to:

U.S. Provisional Patent Application No. 63/223,686,
U.S. Patent Application Publication No. 2014/0344322,
U.S. Pat. Nos. 7,533,068; 8,008,942; 8,195,596; 8,190,548; 8,421,053; 9,424,526; and 10,068,180, and
International Application No. PCT/US2021/024134, and
International PCT Publication Nos. WO 2019/126396 and WO 2021/195368.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A logical qubit comprising:
a first tunable coupler;
a second tunable coupler;
a plurality of fixed couplers comprising at least a first fixed coupler and a second fixed coupler;
a plurality of physical qubits comprising:
a first set of two or more physical qubits connected to the first tunable coupler, at least one of the physical qubits in the first set of two or more physical qubits connected to the first fixed coupler;
a second set of two or more physical qubits connected to the second tunable coupler, at least one of the physical qubits in the second set of two or more physical qubits connected to the second fixed coupler; and a third set of two or more physical qubits connected between the first fixed coupler and the second fixed coupler; and wherein:

each of the first tunable coupler, the plurality of fixed couplers, and the second tunable coupler enforce one of even and odd parity in any connected physical qubits of the plurality of physical qubits;

each coupler in the plurality of fixed couplers is connected to at least two physical qubits in the plurality of physical qubits, at least one coupler of the plurality of fixed couplers is in communication with four physical qubits to provide interaction between the four physical qubits;

at least two discrete qubit paths connect the first tunable coupler and the second tunable coupler; and the first tunable coupler, the second tunable coupler, the plurality of fixed couplers, and the plurality of physical qubits define a lattice.

2. The logical qubit of claim 1, wherein each of the first tunable coupler and the second tunable coupler are connected to an external qubit, the external qubit comprising an additional physical qubit connected on an outer perimeter of the lattice.

3. The logical qubit of claim 2, wherein each external qubit is in communication with one or more additional logical qubits.

4. The logical qubit of claim 1, wherein the plurality of physical qubits comprise pairs of qubits arranged in loops made up of two physical qubits of the plurality of physical qubits, the pairs of qubits coupled by two couplers of the first tunable coupler, the second tunable coupler, and the plurality of fixed couplers.

5. The logical qubit of claim 4, wherein the plurality of fixed couplers are each respective four qubit parity enforcers, and the first tunable coupler and the second tunable coupler are each respective switchable three qubit parity enforcers.

6. The logical qubit of claim 1, wherein the plurality of physical qubits comprises twenty four physical qubits arranged in a three-by-three square lattice.

7. The logical qubit of claim 6, wherein the first and the second tunable couplers are positioned on diagonally opposite corners of the three-by-three square lattice.

8. The logical qubit of claim 6, wherein the first and the second tunable couplers are positioned on first and second exterior sides of the three-by-three square lattice.

9. The logical qubit of claim 6, wherein the first and the second tunable couplers are positioned on an interior of the three-by-three square lattice.

10. The logical qubit of claim 1, further comprising a control signal source coupled to apply a control signal to change a state of one or more physical qubits that make up one of the at least two discrete qubit paths.

11. The logical qubit of claim 10, wherein the control signal source comprises a microwave line.

12. A quantum processor comprising a plurality of logical qubits, each logical qubit comprising:

a first tunable coupler;

a second tunable coupler;

a plurality of fixed couplers comprising at least a first fixed coupler and a second fixed coupler;

a plurality of physical qubits comprising:

a first set of two or more physical qubits connected to the first tunable coupler, at least one of the physical qubits in the first set of two or more physical qubits connected to the first fixed coupler;

a second set of two or more physical qubits connected to the second tunable coupler, at least one of the physical qubits in the second set of two or more physical qubits connected to the second fixed coupler; and a third set of two or more physical qubits connected between the first fixed coupler and the second fixed coupler;

wherein:

each of the first tunable coupler, the plurality of fixed couplers, and the second tunable coupler enforce parity in any connected physical qubits;

each coupler in the plurality of fixed couplers is connected to at least two physical qubits in the plurality of physical qubits, at least one coupler of the plurality of fixed couplers is in communication with four physical qubits and providing interaction between the four physical qubits;

wherein at least two discrete qubit paths connect the first tunable coupler and the second tunable coupler;

the first tunable coupler, the second tunable coupler, the plurality of fixed couplers, and the plurality of physical qubits define a lattice; and each logical qubit of the plurality of logical qubits is communicatively coupled to at least one other logical qubit of the plurality of logical qubits.

13. The quantum processor of claim 12, wherein coupled logical qubits are connected by two physical qubits and an intermediate coupler.

14. The quantum processor of claim 12, wherein coupled logical qubits are connected by one shared physical qubit.

15. The quantum processor of claim 12, wherein coupled logical qubits are directly coupled with a tunable four qubit coupler by sharing a tunable coupler.

16. The quantum processor of claim 12, wherein multiple logical qubits are coupled by physical qubits connected to an intermediate coupler.

17. The quantum processor of claim 12, wherein four logical qubits are coupled by four external qubits and an intermediate tunable four qubit coupler, each external qubit comprising an additional physical qubit connected on an outer perimeter of the lattice.

18. The quantum processor of claim 12, wherein four logical qubits are coupled by a single shared physical qubit.

19. The quantum processor of claim 12, further comprising a control signal source communicatively coupled to change a state of one or more physical qubits in communication with one of the at least two discrete qubit paths.

20. The quantum processor of claim 19, wherein the control signal source comprises a microwave line.

* * * * *